US012610449B2

(12) United States Patent
Ju et al.

(10) Patent No.: US 12,610,449 B2
(45) Date of Patent: Apr. 21, 2026

(54) ELECTRONIC DEVICE INCLUDING THERMAL INTERFACE MATERIAL

(71) Applicant: Samsung Electronics Co., Ltd., Suwon-si (KR)

(72) Inventors: Wanjae Ju, Suwon-si (KR); Kiyeong Jeong, Suwon-si (KR); Nurimaka Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 246 days.

(21) Appl. No.: 18/583,223

(22) Filed: Feb. 21, 2024

(65) Prior Publication Data

US 2024/0381523 A1     Nov. 14, 2024

Related U.S. Application Data

(63) Continuation of application No. PCT/KR2024/002043, filed on Feb. 13, 2024.

(30) Foreign Application Priority Data

May 8, 2023  (KR) ........................ 10-2023-0058997
Jun. 29, 2023  (KR) ........................ 10-2023-0084437

(51) Int. Cl.
   *H05K 1/02*     (2006.01)
   *H05K 3/42*     (2006.01)
(52) U.S. Cl.
   CPC ........... *H05K 1/0201* (2013.01); *H05K 3/425* (2013.01); *H05K 2201/0715* (2013.01); *H05K 2203/1147* (2013.01)

(58) Field of Classification Search
   CPC .. H05K 9/0024; H05K 9/0026; H05K 9/0022; H05K 1/0201
   See application file for complete search history.

(56) References Cited

U.S. PATENT DOCUMENTS 10,642,323 B2   5/2020  Lee et al.
11,490,550 B2   11/2022  Jung et al.
               (Continued)

FOREIGN PATENT DOCUMENTS

CN       105792504 A      7/2016
CN       106793723 A      5/2017
               (Continued)

OTHER PUBLICATIONS

International Search Report dated May 28, 2024, issued in International Patent Application No. PCT/KR2024/002043.

*Primary Examiner* — Timothy J Thompson
*Assistant Examiner* — Amol H Patel
(74) *Attorney, Agent, or Firm* — Jefferson IP Law, LLP

(57) ABSTRACT

An electronic device is provided. The electronic device includes a printed circuit board including a through hole, an electronic component disposed on the printed circuit board, a shield can covering the electronic component, and a thermal interface material (TIM) included in a space between the printed circuit board and the shield can. The thermal interface material occupies a space between a surface of the electronic component and the shield can, and contacts the first electronic component. A space between the printed circuit board and the shield can is connected to an external space of the shield can through an opening.

20 Claims, 21 Drawing Sheets

(56)  References Cited

U.S. PATENT DOCUMENTS

| | | | |
|---|---|---|---|
| 11,555,657 B2 | 1/2023 | Lee et al. | |
| 2010/0046190 A1* | 2/2010 | Tsunemasu | H05K 9/0026 |
| | | | 361/816 |
| 2012/0098119 A1* | 4/2012 | Refai-Ahmed | H01L 23/42 |
| | | | 438/109 |
| 2019/0121407 A1* | 4/2019 | Lee | G06F 1/183 |
| 2020/0194341 A1* | 6/2020 | Cheng | H01L 21/486 |
| 2024/0188218 A1 | 6/2024 | Cho et al. | |

FOREIGN PATENT DOCUMENTS

| | | |
|---|---|---|
| CN | 111356308 A | 6/2020 |
| JP | H07106789 A | 4/1995 |
| KR | 10-0703212 B1 | 4/2007 |
| KR | 10-2017-0097541 A | 8/2017 |
| KR | 10-2018-0074421 A | 7/2018 |
| KR | 10-2019-0044411 A | 4/2019 |
| KR | 10-2021-0063824 A | 6/2021 |
| KR | 10-2023-0023248 A | 2/2023 |

* cited by examiner

101

218 200C

200C 205 202

200C 212

200A

213

217 211

201A 204

200B 218 201

201B 218

218

203 208 207

200C

210: 200A, 200B, 200C y z x

ELECTRONIC DEVICE INCLUDING THERMAL INTERFACE MATERIAL

CROSS-REFERENCE TO RELATED APPLICATION(S)

This application is a continuation application, claiming priority under § 365 (c), of an International application No. PCT/KR2024/002043, filed on Feb. 13, 2024, which is based on and claims the benefit of a Korean patent application number 10-2023-0058997, filed on May 8, 2023, in the Korean Intellectual Property Office, and of a Korean patent application number 10-2023-0084437, filed on Jun. 29, 2023, in the Korean Intellectual Property Office, the disclosure of each of which is incorporated by reference herein in its entirety.

BACKGROUND

1. Field

The disclosure relates to an electronic device including a thermal interface material.

2. Description of Related Art

An electronic device may include a plurality of electronic components to implement various functions. When operating by consuming power, an electronic component may generate heat. Heat generated from the electronic component may cause a deterioration in a function of the electronic device by increasing a temperature of the electronic component. The electronic device may include a member for radiating heat generated from the electronic component. For example, the electronic device may include a thermal interface material (TIM) configured to transfer heat. Heat generated from the electronic component may be diffused through the thermal interface material. In order to suppress temperature increases in the electronic device, it may be required to fill an enclosed space with the thermal interface material.

The above information is presented as background information only to assist with an understanding of the disclosure. No determination has been made, and no assertion is made, as to whether any of the above might be applicable as a prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device including a thermal interface material.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device may comprise a printed circuit board including a first surface, a second surface opposite to the first surface, and a first through hole passing through the first surface and the second surface. The electronic device may comprise a first electronic component disposed on the first surface. The electronic device may comprise a first shield can disposed on a partial area of the first surface including the first through hole, and covering the first electronic component. The electronic device may comprise a thermal interface material injected through the first through hole, and included in a space between the first surface and the first shield can. The first shield can may include a first part substantially parallel to the first surface and a second part extending from a periphery of the first part to the first surface and coupled to the first surface. The thermal interface material may at least partially occupy a space between the first part and a surface of the first electronic component facing the first part, and may be at least partially in contact with the first electronic component. The space between the first surface and the first shield can may be connected to an external space of the first shield can through at least one opening part formed in at least one of the first shield can or the printed circuit board.

In accordance with another aspect of the disclosure, an electronic device is provided. The electronic device may comprise a printed circuit board including a first surface, a second surface opposite to the first surface, and a first through hole passing through the first surface and the second surface. The electronic device may comprise a first electronic component disposed on the first surface. The electronic device may comprise a second electronic component disposed on the second surface. The electronic device may comprise a first shield can disposed on a partial area of the first surface including the first through hole, and covering the first electronic component. The electronic device may comprise a second shield can disposed on the second surface, facing at least partially the first shield can, spaced apart from the first through hole, and covering the second electronic component. The electronic device may comprise a thermal interface material injected through the first through hole, and included in a space between the first surface and the first shield can. The thermal interface material may occupy a space between a first part of the first shield can parallel to the first surface and the first electronic component, and may at least partially contact with the first electronic component.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include computer-executable instructions. The entirety of the one or more computer programs may be stored in a single memory or the one or more computer programs may be divided with different portions stored in different multiple memories.

Any of the functions or operations described herein can be processed by one processor or a combination of processors. The one processor or the combination of processors is circuitry performing processing and includes circuitry like an application processor (AP, e.g., a central processing unit (CPU)), a communication processor (CP, e.g., a modem), a graphical processing unit (GPU), a neural processing unit (NPU) (e.g., an artificial intelligence (AI) chip), a wireless-fidelity (Wi-Fi) chip, a Bluetooth™ chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an IC, or the like.

Figure 1:
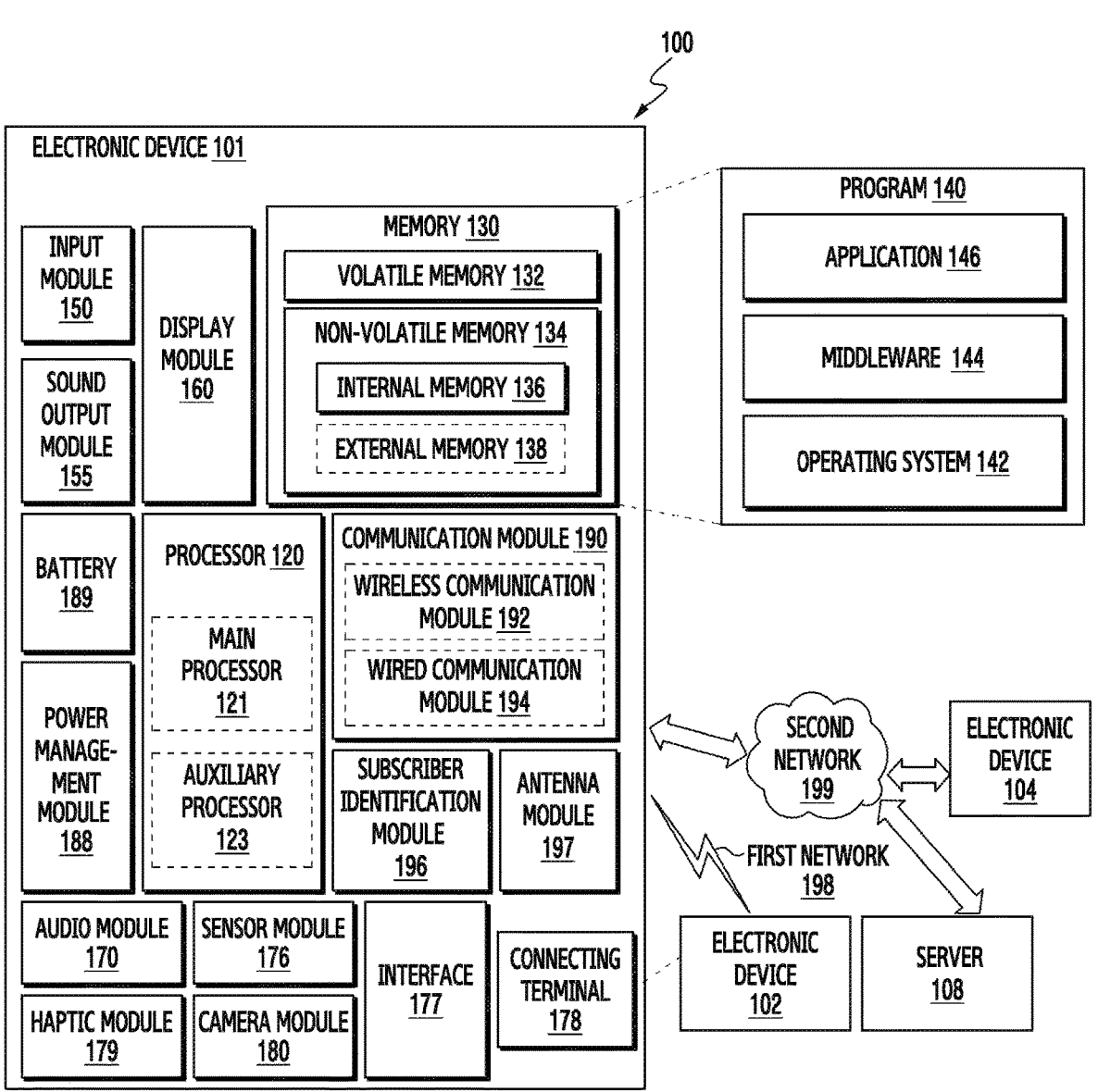
FIG. 1 is a block diagram of an electronic device in a network environment, according to an embodiment.

FIG. 1 is a block diagram illustrating an electronic device in a network environment, according to an embodiment.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 gigabits per second (Gbps) or more) for implementing eMBB, loss coverage (e.g., 164 dB or less) for implementing mMTC, or U-plane latency (e.g., 0.5 milliseconds (ms) or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., a smart home, a smart city, a smart car, or healthcare) based on 5G communication technology or IoT-related technology.

Figure 2:
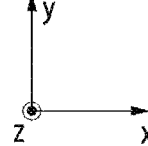
FIG. 2 illustrates an exemplary electronic device.

FIG. 2 illustrates an exemplary electronic device.

Referring to FIG. 2, According to an example, an electronic device 101 may include a housing 210 forming an exterior of the electronic device 101. For example, the housing 210 may include a first surface (or front surface) 200A, a second surface (or rear surface) 200B, and a third surface (or side surface) 200C surrounding a space between the first surface 200A and the second surface 200B.

According to an example, the electronic device 101 may include a substantially transparent first plate 202. According to an example, the first plate 202 may form at least a part of the first surface 200A. According to an example, the first plate 202 may include, for example, a glass plate including various coating layers or a polymer plate, but is not limited thereto.

According to an example, the electronic device 101 may include a substantially opaque second plate 211. According to an example, the second plate 211 may form at least a part of the second surface 200B. According to an example, the second plate 211 may be formed by coating or coloring glass, ceramic, polymer, metal (e.g., aluminum, stainless steel (STS), or magnesium), or a combination of at least two of the above materials.

According to an example, the electronic device 101 may include a frame 218. According to an example, the frame 218 may be combined with the first plate 202 and/or the second plate 211 to form at least a part of the third surface 200C of the electronic device 101. For example, the frame 218 may form entirely third surface 200C of the electronic device 101. For example, the frame 218 may form the third surface 200C of the electronic device 101 together with the first plate 202 and/or the second plate 211.

According to an example, the electronic device 101 may include at least one of a display 201, an audio modules 203, 204, and 207, a sensor module (not shown), a camera module 205, 212, and 213, a key input device 217, a light emitting device (not shown), and/or a connector hole 208. According to an example, the electronic device 101 may omit at least one of the above components (e.g., the key input device 217 or the light emitting device (not shown)), or may additionally include another component.

According to an example, at least a part of the display 201 (e.g., the display module 160 of FIG. 1) may be visible through the first plate 202 forming the first surface 200A. According to an example, the display 201 may be disposed on a rear surface of the first plate 202.

According to an example, an outer shape of the display 201 may be formed substantially the same as an outer shape of the first plate 202 adjacent to the display 201. According to an example, in order to increase an area in which the display 201 is visually exposed, an interval between the outside of the display 201 and the outside of the first plate 202 may be formed substantially the same.

According to an example, the display 201 (or the first surface 200A of the electronic device 101) may include a screen display area 201A. According to an example, the display 201 may provide visual information to a user through the screen display area 201A. In an illustrated embodiment, although it is illustrated that the screen display area 201A is spaced apart from the outside of the first surface 200A and is located inside the first surface 200A when the first surface 200A is viewed in front, but is not limited thereto. According to an example, when the first surface 200A is viewed in front, at least a part of a periphery of the screen display area 201A may substantially match a periphery of the first surface 200A (or the first plate 202).

According to an example, the screen display area 201A may include a sensing area 201B configured to obtain biometric information of a user. Herein, the meaning of "the screen display area 201A includes the sensing area 201B" may be understood as at least a part of the sensing area 201B capable of being overlapped with the screen display area 201A. For example, the sensing area 201B may refer to an area in which visual information may be displayed by the display 201 like another area of the screen display area 201A, and additionally obtain the user's biometric information (e.g., fingerprint). According to an example, the sensing area 201B may be formed in the key input device 217.

According to an example, the display 201 may include an area in which a first camera module 205 (e.g., the camera module 180 of FIG. 1) is located. According to an example, an opening is formed in the area of the display 201, and the first camera module 205 (e.g., a punch hole camera) may be disposed at least partially within the opening to face the first surface 200A. In this case, the screen display area 201A may surround at least a part of a periphery of the opening. According to an example, the first camera module 205 (e.g., an under display camera (UDC)) may be disposed under the display 201 to overlap the area of the display 201. In this case, the display 201 may provide visual information to the user through the area, and additionally, the first camera module 205 may obtain an image corresponding to a direction facing the first surface 200A through the area of the display 201.

According to an example, the display 201 may be coupled to or disposed adjacent to a touch detection circuit, a pressure sensor capable of measuring strength (pressure) of touch, and/or a digitizer detecting a magnetic field-type stylus pen.

According to an example, the audio modules 203, 204, and 207 (e.g., the audio module 170 of FIG. 1) may include a microphone hole 203 and 204 and/or a speaker hole 207.

According to an example, the microphone hole 203 and 204 may include a first microphone hole 203 formed in a partial area of the third surface 200C and/or a second microphone hole 204 formed in a partial area of the second surface 200B. A microphone (not shown) for obtaining an external sound may be disposed inside the microphone hole 203 and 204. The microphone may include a plurality of microphones to detect a direction of sound.

According to an example, the second microphone hole 204 formed in a partial area of the second surface 200B may be disposed adjacent to the camera module 212 and 213. For example, the second microphone hole 204 may obtain sound according to an operation of the camera module 212 and 213. However, it is not limited thereto.

According to an example, the speaker hole 207 may include an external speaker hole 207 and a receiver hole for calling (not shown). The external speaker hole 207 may be formed in a part of the third surface 200C of the electronic device 101. According to an example, the external speaker hole 207 and the microphone hole 203 may be implemented as one hole. Although not shown, the receiver hole for calling (not shown) may be formed in another part of the third surface 200C. For example, the receiver hole for calling may be formed on an opposite side of the external speaker hole 207 in the third side 200C. For example, based on the illustration of FIG. 2, the external speaker hole 207 may be formed on the third surface 200C corresponding to a lower end portion of the electronic device 101, and the receiver hole for calling may be formed on the third surface 200C corresponding to an upper end portion of the electronic device 101. However, it is not limited thereto, and according to an example, the receiver hole for calling may be formed at a position other than the third surface 200C. For example, the receiver hole for calling may be formed by a spaced apart space between the first plate 202 (or the display 201) and the frame 218.

According to an example, the electronic device 101 may include at least one speaker (not shown) configured to output sound to the outside of the housing 210 through the external speaker hole 207 and/or the receiver hole for calling (not shown).

According to an example, a sensor module (not shown) (e.g., the sensor module 176 of FIG. 1) may generate an electrical signal or a data value corresponding to an internal operating state of the electronic device 101 or an external environmental state. For example, the sensor module may include at least one of a proximity sensor, an HRM sensor, a fingerprint sensor, a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

According to an example, the camera module 205, 212, and 213 (e.g., the camera module 180 of FIG. 1) may include a first camera module 205 disposed to face the first surface 200A of the electronic device 101, a second camera module 212 disposed to face the second surface 200B, and a flash 213.

According to an example, the second camera module 212 may include a plurality of cameras (e.g., dual camera, triple camera, or quad camera). However, the second camera module 212 is not necessarily limited to including the plurality of cameras, and may include one camera.

According to an example, the first camera module 205 and the second camera module 212 may include one or more lenses, an image sensor, and/or an image signal processor.

According to an example, the flash 213 may include, for example, a light emitting diode or a xenon lamp. According to an example, two or more lenses (infrared camera, wide-angle and telephoto lens) and image sensors may be disposed on a surface of the electronic device 101.

According to an example, the key input device 217 (e.g., the input module 150 of FIG. 1) may be disposed on the third surface 200C of the electronic device 101. According to an example, the electronic device 101 may not include some or all of the key input devices 217, and the key input device 217, which is not included, may be implemented on the display 201 in another form, such as a soft key.

According to an example, the connector hole 208 may be formed on the third surface 200C of the electronic device 101 so that a connector of an external device may be accommodated. A connecting terminal (e.g., the connecting terminal 178 of FIG. 1) electrically connected to the connector of the external device may be disposed in the connector hole 208. According to an example, the electronic device 101 may include an interface module (e.g., the interface 177 of FIG. 1) for processing an electrical signal transmitted and received through the connection terminal.

According to an example, the electronic device 101 may include a light emitting device (not shown). For example, the light emitting device (not shown) may be disposed on the first surface 200A of the housing 210. The light emitting device (not shown) may provide state information of the electronic device 101 in an optical form. According to an example, the light emitting device (not shown) may provide a light source linked with an operation of the first camera module 205. For example, the light emitting device (not shown) may include an light-emitting diode (LED), an IR LED, and/or a xenon lamp.

Figure 3:
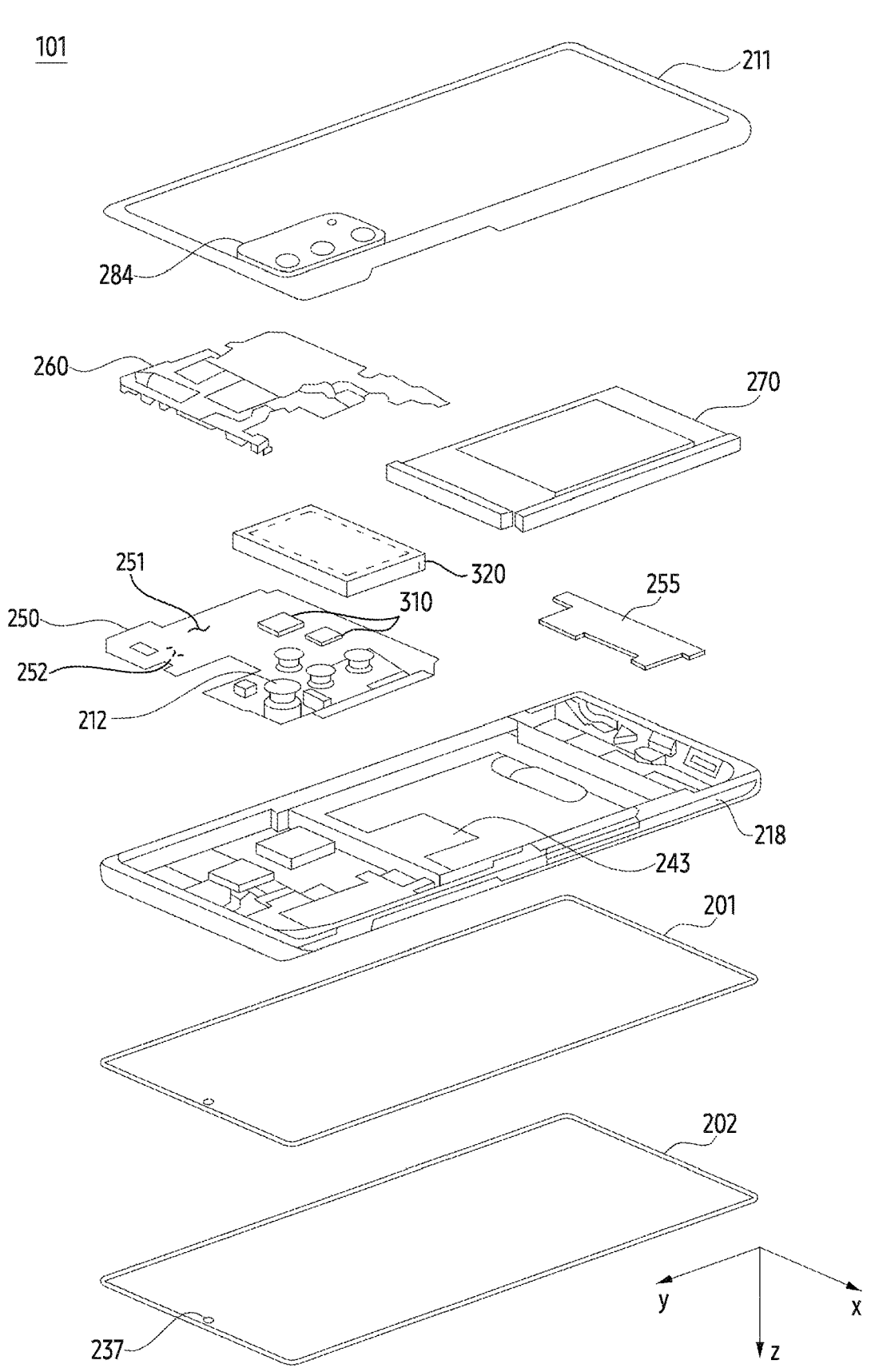
FIG. 3 is an exploded perspective view of an exemplary electronic device.

FIG. 3 is an exploded perspective view of an exemplary electronic device.

Hereinafter, overlapping descriptions of a component having the same reference number as the above-described component will be omitted.

Referring to FIG. 3, According to an example, an electronic device 101 may include a display 201, a first plate 202, a second plate 211, a frame 218, a support member 243, a printed circuit board 250, a sub-printed circuit board 255, a cover plate 260, a battery 270, and/or a shield can 320.

According to an example, the electronic device 101 may include the frame 218 forming an exterior (e.g., the third surface 200C of FIG. 2) of the electronic device 101 and the support member 243 extending inward from the frame 218. According to an example, the frame 218 and the support member 243 may be disposed between the display 201 and the second plate 211. For example, the frame 218 may surround a space between the second plate 211 and the first plate 202 (and/or the display 201). For example, the support member 243 may extend from the frame 218 within the space.

According to an example, the support member 243 may support or accommodate other components included in the electronic device 101. For example, the display 201 may be disposed on a surface of the support member 243 facing a direction (e.g., +z direction), and may be supported by the support member 243. For example, the printed circuit board 250, the battery 270, and a second camera module 212 may be disposed on another surface of the support member 243 facing a direction (e.g., −z direction) opposite to the above direction. For example, the printed circuit board 250, the battery 270, and the second camera module 212 may be seated in a recess defined by the frame 218 and/or the support member 243.

According to an example, the printed circuit board 250 and the battery 270 may be coupled to the support member 243, respectively. For example, the printed circuit board 250 may be fixedly disposed on the support member 243 through a coupling member, such as a screw. For example, the battery 270 may be fixedly disposed on the support member 243 through an adhesive member (e.g., double-sided tape). However, it is not limited by the above-described example.

According to an example, the cover plate 260 may be disposed between the printed circuit board 250 and the second plate 211. According to an example, the cover plate 260 may be disposed on the printed circuit board 250. For example, the cover plate 260 may be disposed on a surface of the printed circuit board 250 facing the −z direction.

According to an example, the cover plate 260 may at least partially overlap the printed circuit board 250 with respect to the z-axis. According to an example, the cover plate 260 may cover at least a partial area of the printed circuit board 250. Accordingly, the cover plate 260 may protect the printed circuit board 250 from physical impact or prevent a connector coupled to the printed circuit board 250 from being separated.

According to an example, the cover plate 260 may be fixed to the printed circuit board 250 through a coupling member (e.g., a screw), or may be coupled to the support member 243 along with the printed circuit board 250 through the coupling member.

According to an example, the display 201 may be disposed between the support member 243 and the first plate 202. For example, the first plate 202 may be disposed on a side (e.g., the +z direction) of the display 201, and the support member 243 may be disposed on another side (e.g., the −z direction).

According to an example, the first plate 202 may be coupled to the display 201. For example, the first plate 202 and the display 201 may be adhered to each other through an optical adhesive member (e.g., optically clear adhesive (OCA) or optically clean resin (OCR)) interposed therebetween.

According to an example, the first plate 202 may be coupled to the frame 218. For example, when viewed in the z-axis direction, the first plate 202 may include an outer portion extending outside the display 201 and may be adhered to the frame 218 through an adhesive member (e.g., waterproof tape) disposed between the outer portion of the first plate 202 and the frame 218. However, it is not limited by the above-described example.

According to an example, a processor (e.g., the processor 120 of FIG. 1), memory (e.g., the memory 130 of FIG. 1), and/or an interface (e.g., the interface 177 of FIG. 1) may be disposed on the printed circuit board 250. The processor may include, for example, one or more of a central processing unit, an application processor, a graphic processing unit, an image signal processor, a sensor hub processor, or a communication processor. The memory may include, for example, volatile memory or non-volatile memory. The interface may include, for example, a high definition multimedia interface (HDMI), a universal serial bus (USB) interface, an SD card interface, and/or an audio interface. The interface may electrically or physically connect the electronic device 101 to an external electronic device, and may include a USB connector, an SD card/multimedia card (MMC) connector, or an audio connector. According to an example, the electronic device 101 may include the sub-printed circuit board 255. The printed circuit board 250 and the sub-printed circuit board 255 may be operatively or electrically connected to each other through a connection member (e.g., a flexible printed circuit board).

According to an example, the battery 270 (e.g., the battery 189 of FIG. 1) may supply power to at least one component of the electronic device 101. For example, the battery 270 may include a rechargeable secondary battery or a fuel cell. At least a part of the battery 270 may be disposed on substantially the same plane as the printed circuit board 250 and/or the sub-printed circuit board 255.

According to an example, the electronic device 101 may include an antenna module (not shown) (e.g., the antenna module 197 of FIG. 1). According to an example, the antenna module may be disposed between the second plate 211 and the battery 270. The antenna module may include, for example, a near field communication (NFC) antenna, a wireless charging antenna, and/or a magnetic secure transmission (MST) antenna. The antenna module may, for example, perform short-range communication with an external device or wirelessly transmit and receive power with the external device.

According to an example, the first camera module 205 (e.g., a front camera) may be disposed on at least a part of the support member 243 so that a lens may receive external light through a partial area (e.g., a camera area 237) of the first plate 202 (e.g., the front 200A of FIG. 2).

According to an example, the second camera module 212 (e.g., a rear camera) may be disposed between the support member 243 and the second plate 211. According to an example, the second camera module 212 may be electrically connected to the printed circuit board 250 through a connection member (e.g., a connector). According to an example, the second camera module 212 may be disposed so that a lens may receive external light through a camera area 284 of the second plate 211 of the electronic device 101.

According to an example, the camera area 284 may be formed on a surface (e.g., the rear surface 200B of FIG. 2) of the second plate 211. According to an example, the camera area 284 may be formed at least partially transparent so that external light may be incident on a lens of the second camera module 212. According to an example, at least a part of the camera area 284 may protrude from the surface of the second plate 211 to a predetermined height. However, it is not limited thereto, and according to an example, the camera area 284 may form substantially the same plane as the surface of the second plate 211.

According to an example, the housing 210 of the electronic device 101 may mean a configuration or structure that forms at least a part of the exterior of the electronic device 101. In this regard, at least a part of the first plate 202, the frame 218, and/or the second plate 211 forming the exterior of the electronic device 101 may be referred to as the housing 210 of the electronic device 101.

According to an example, the printed circuit board 250 may include a first surface 251 and a second surface 252. For example, the first surface 251 may be a surface of the printed circuit board 250 facing the second plate 211. The second surface 252 may be a surface of the printed circuit board 250 facing the display 201. The second surface 252 may be opposite to the first surface 251. The first surface 251 may face the −z direction, and the second surface 252 may face the +z direction.

According to an example, the electronic device 101 may include a first shield can 320 for covering a first electronic component 310 disposed on the first surface 251 of the printed circuit board 250. The first shield can 320 may be disposed on a surface of the printed circuit board 250 and may at least partially cover the first electronic component 310. For example, the first electronic component 310 disposed between the printed circuit board 250 and the first shield can 320 may be accommodated in a space (e.g., a space S1 of FIG. 4A) covered by the first surface 251 and the first shield can 320. The first shield can 320 may be configured to reduce electromagnetic interference between the first electronic component 310 accommodated in the first shield can 320 and another electronic component disposed outside the first shield can 320. For example, the first shield can 320 may shield an electromagnetic wave emitted from the first electronic component 310 accommodated in the first shield can 320 from reaching the other electronic components outside the first shield can 320, and may shield an electromagnetic wave emitted from the other electronic component from flowing to the first shield can 320.

Figure 4A:
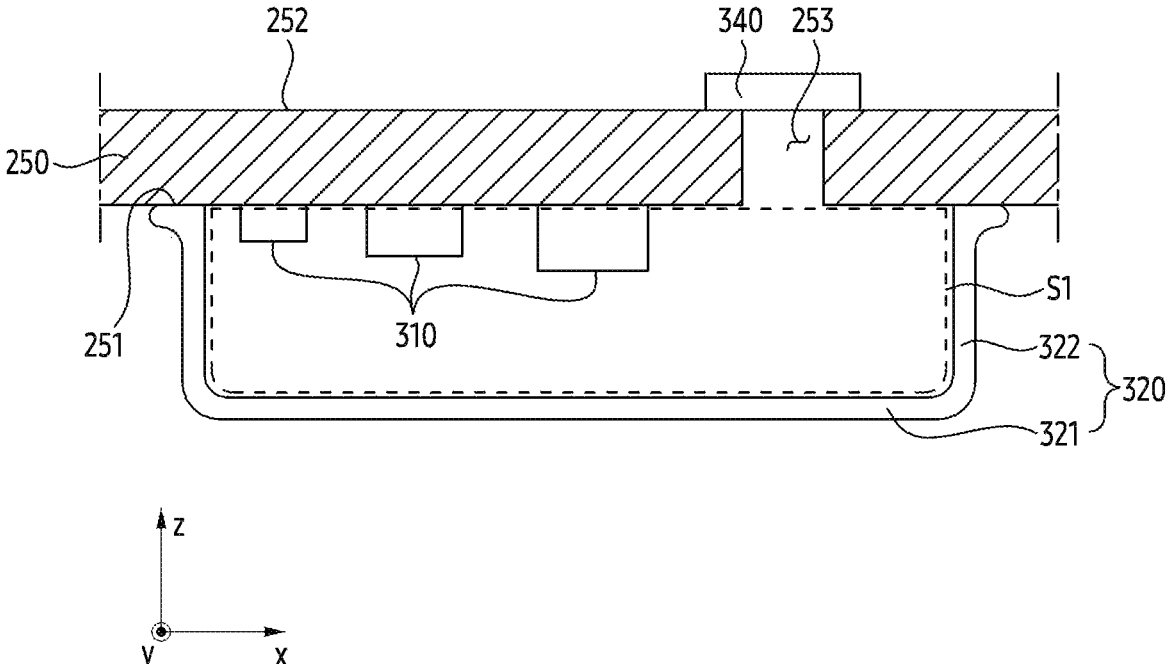
FIG. 4A illustrates an exemplary printed circuit board in a state before a thermal interface material is injected.
Figure 4B:
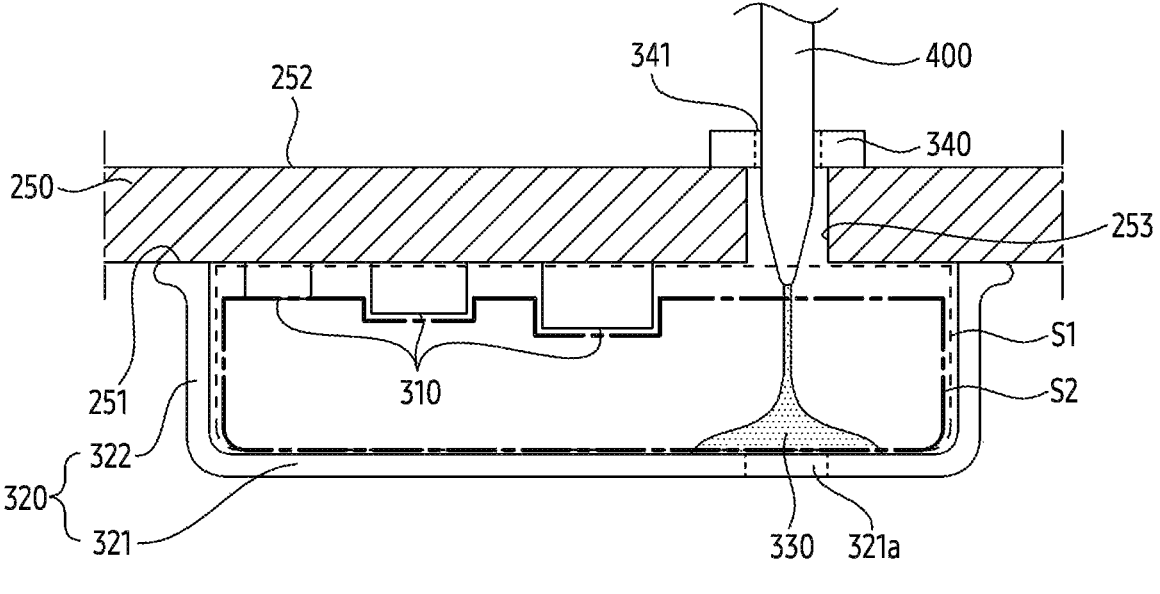
FIG. 4B illustrates an exemplary state in which a thermal interface material is being injected into a space between a printed circuit board and a first shield can.
Figure 4B:
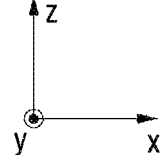

According to an example, the electronic device 101 may include a thermal interface material (TIM) 330 (e.g., a thermal interface material 330 of FIG. 4B). For example, the thermal interface material 330 may include a polymer composite material and a thermally conductive filler. The thermal interface material 330 may suppress an increase in the internal temperature of the electronic device 101 by diffusing heat generated from the first electronic component 310 covered by the first shield can 320. As the number of electronic components integrated in the printed circuit board 250 increases to implement various functions of the electronic device 101, a greater amount of heat may be generated in an enclosed space S1. Since the first shield can 320 forms a substantially sealed space (e.g., a space S1 of FIG. 4A) to shield an electromagnetic wave, heat generated from the first electronic component 310 may stay within the space S1, so that the temperature of the electronic device may increase. In order to diffuse the heat generated from the first electronic component 310, a large amount of thermal interface material 330 may be required to be included in the space S1 between the first shield can 320 and the printed circuit board 250.

An exemplary electronic device 101 may increase density of the thermal interface material 330 included between the printed circuit board 250 and the first shield can 320 via a simple structure and process. Hereinafter, a structure of the electronic device 101 will be described with reference to drawings.

Figure 4C:
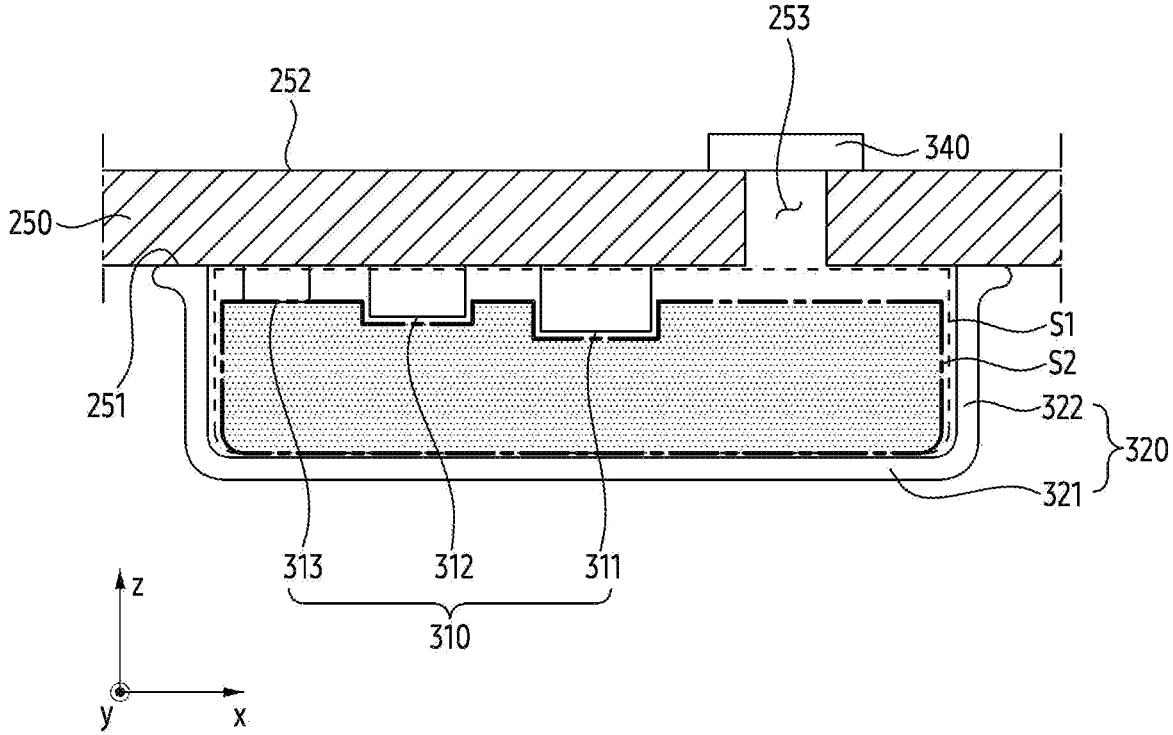
FIG. 4C illustrates an exemplary printed circuit board in a state in which a thermal interface material is injected.

FIG. 4A illustrates an exemplary printed circuit board in a state before a thermal interface material is injected. FIG. 4B illustrates an exemplary state in which a thermal interface material is being injected into a space between a printed circuit board and a first shield can. FIG. 4C illustrates an exemplary printed circuit board in a state in which a thermal interface material is injected.

Referring to FIG. 4A, an exemplary electronic device (e.g., the electronic device 101 of FIG. 2) may include a printed circuit board 250, a first electronic component 310, and a first shield can 320.

For example, the printed circuit board 250 may include a plurality of conductive layers and a plurality of non-conductive layers alternately laminated with the plurality of conductive layers. The printed circuit board 250 may provide an electrical connection of electronic components electrically connected to the printed circuit board 250, by using wiring and a conductive via formed by the conductive layers. The printed circuit board 250 may include a first surface 251 and a second surface 252. Electronic components may be disposed on the first surface 251 and the second surface 252. The second surface 252 may be opposite to the first surface 251. The first electronic component 310 may be disposed on the first surface 251.

The printed circuit board 250 may include a first through hole 253. The first through hole 253 may pass through the first surface 251 and the second surface 252. The first through hole 253 may be used as a passage into which a nozzle (e.g., a nozzle 400 of FIG. 4B) for injecting a thermal interface material (e.g., a thermal interface material 330 of FIG. 4B) into a space S1 between the first surface 251 of the printed circuit board 250 and the first shield can 320 is inserted. The first through hole 253 may face the first shield can 320 so that the thermal interface material 330 may be injected into the space S1 between the first surface 251 and the first shield can 320. For example, when the second surface 252 of the printed circuit board 250 is viewed from above, the first through hole 253 may be connected to the space S1 covered by the first shield can 320. For example, the first through hole 253 may be overlapped the first shield can 320.

According to an example, the electronic device 101 may include a sealing member 340 covering the first through hole 253. The sealing member 340 may be disposed on the second surface 252, and face the first through hole 253 by being disposed over the first through hole 253 (e.g., +z direction). The sealing member 340 may be configured to reduce the thermal interface material 330 injected into the space S1 from flowing back through the first through hole 253. A structure and a function of the sealing member 340 will be described later with reference to FIG. 8.

According to an example, the first shield can 320 may be disposed on the first surface 251. The first shield can 320 may at least partially cover the first electronic component 310 disposed on the first surface 251. For example, the first shield can 320 may form a substantially sealed space by covering a partial area of the first surface 25. The first shield can 320 may be configured to shield noise related to the first electronic component 310 that is at least partially covered by the first shield can 320. For example, when the first electronic component 310 operates, an electromagnetic wave may be generated from the first electronic component 310. When the electromagnetic wave is transferred to another electronic component, it may cause malfunction of the other electronic component, thereby interfering with a normal operation of the other electronic component. For example, in case that an electromagnetic wave generated when another electronic component operates is transmitted to the first electronic component 310, a normal operation of the first electronic component 310 may be hindered. The first shield can 320 may be configured to shield an electromagnetic wave emitted by an operation of the first electronic component 310 from being transferred to another electronic component by at least partially covering the first electronic component 310. The first shield can 320 may be configured to shield an electromagnetic wave emitted from the other electronic component from being transferred to the first electronic component 310. For example, in order to shield an electromagnetic wave, the first shield can 320 may include a conductive material (e.g., metal) and may be electrically connected to a ground layer of the printed circuit board 250.

According to an example, when the first electronic component 310 operates, the first electronic component 310 may generate heat. Heat generated from the first electronic component 310 may increase the temperature of the electronic device 101. When the temperature of the electronic device 101 rises above a certain temperature, a function of a component of the electronic device 101 may be deteriorated or the electronic device 101 may fail.

Referring to FIG. 4B, the thermal interface material 330 may be injected into the space S1 between the first surface 251 and the first shield can 320 in order to diffuse heat generated from the first electronic component 310. For example, a nozzle 400 for injecting the thermal interface material 330 may be inserted into the space S1 through the first through hole 253. For example, the nozzle 400 may passes through a side of the first through hole 253 formed on the second surface 252, and may be inserted into the space S1 through another side of the first through hole 253 formed on the first surface 251. The sealing member 340 may include an insertion area (e.g., an insertion area 341 of FIG. 8) that allows insertion of the nozzle 400. After the nozzle 400 is inserted into the space S1 between the first surface 251 and the first shield can 320, the thermal interface material 330 may be injected into the space S1 through the nozzle 400. The thermal interface material 330 may be injected in a semi-solid (or quasi-solid) state (e.g., gel) and/or a liquid state to at least partially fill the space S1. Since the nozzle 400 is inserted in a direction (e.g., −z direction) facing the first surface 251 from the second surface 252, the thermal interface material 330 discharged from the nozzle 400 may be injected in the direction (e.g., −z direction). According to an example, the thermal interface material 330 may be filled from a bottom of the first shield can 320 toward the first surface 251.

According to an example, the first shield can 320 may include a first part 321 and a second part 322. For example, the first part 321 is a part of the first shield can 320 facing the first surface 251, and may be substantially parallel to the printed circuit board 250. A partial area 321*a* of the first part 321 may face the first through hole 253. The partial area 321*a* may include an area of the first part 321 facing the first through hole 253 when the printed circuit board 250 is viewed from above. For example, the second part 322 may be a part of the first shield can 320 extending from a periphery of the first part 321 to the first surface 251 and coupled to the first surface 251. As the thermal interface material 330 is discharged from the nozzle 400, the space S1 between the first surface 251 and the shield can 320 may be filled by the thermal interface material 330.

For example, when the space S1 is at least partially filled by the thermal interface material 330, the thermal interface material 330 may first contact a partial area 321*a* of the first part 321, and then may be filled in a direction (e.g., +z direction) facing the first surface 251 from the first part 321. For example, the thermal interface material 330 may be discharged to the partial area 321*a* of the first part 321 facing the first through hole 253. As the thermal interface material 330 is continuously discharged from the nozzle 400, the thermal interface material 330 may at least partially occupy the space S1 while accumulating in a direction facing the first surface 251 from the first part 321. Since at least a part of a contact between the first electronic component 310 and the thermal interface material 330 is required in order for heat generated from the first electronic component 310 to be diffused through the thermal interface material 330, the thermal interface material 330 may be filled until it contacts with at least a part of the first electronic component 310. The thermal interface material 330 may be filled in a direction (e.g., +z direction) facing the first surface 251 from the first part 321, until it contacts with at least a part of the first electronic component 310. The amount of thermal interface material 330 discharged through the nozzle 400 may be preset to be more than a contactable amount between the thermal interface material 330 and at least a part of the first electronic component 310, by occupying a space S2 between the first part 321 and a surface of the first electronic component 310 facing the first part 321. The space S2 may be at least a part of the space S1.

Referring to FIG. 4C, when the thermal interface material 330 is at least partially filled in the space S1 between the first surface 251 and the first shield can 320, a nozzle (e.g., the nozzle 400 of FIG. 4B) may be extracted through the first through hole 253. In a state in which a thermal interface material (e.g., the thermal interface material 330 of FIG. 4B) is injected, the thermal interface material 330 may contact at least a part of the first electronic component 310, by occupying the space S2 between the first part 321 and a surface of the first electronic component 310 facing the first part 321. In other words, in order for the thermal interface material 330 to contact at least partially the first electronic component 310, the thermal interface material 330 may occupy the space S2 among the spaces S1 between the first surface 251 and the first shield can 320. As the thermal interface material 330 at least partially contacts the first electronic component 310, heat generated from the first electronic component 310 may be conducted to the first shield can 320 by the thermal interface material 330 and may be diffused to the outside of the first shield can 320. According to an example, the space S2 may be referred to as a space capable of being filled with the thermal interface material 330, among the space S1 between the first surface 251 and the first shield can 320. For example, volume of the space S2 may be referred to as volume excluding volume of the first electronic component 310 from volume of the space S1. However, it is not limited thereto. The volume of the space S2 may be less than or equal to volume excluding the volume of the first electronic component 310 from the volume of the space S1.

According to an example, among the first electronic components 310, an electronic component that emits more heat may be adjacent to the first through hole 253. Since the thermal interface material 330 is discharged from the nozzle 400 inserted into the first through hole 253, the first electronic component 310 that is closer to the first through hole 253 may be easier to contact to the thermal interface material 330. For example, heat generated when the electronic component 311 disposed closer to the first through hole 253 operates may be greater than heat generated when the electronic component 312 and 313 disposed farther from the first through hole 253 operate than the electronic component 311.

According to an example, although not illustrated, among the first electronic components 310, an electronic component having a small size may be adjacent to the first through hole 253. For example, a size of the electronic component 311 disposed closer to the first through hole 253 may be smaller than a size of the electronic component 312 and 313 disposed farther from the first through hole 253 than the electronic component 311.

According to an example, a first direction (e.g., −z direction) in which the thermal interface material 330 is injected may be substantially opposite to a second direction (e.g., +z direction) in which the thermal interface material 330 fills the space S1 between the first surface 251 and the first shield can 320. Since the first electronic component 310 disposed on the first surface 251 is disposed to face the first shield can 320 from the first surface 251, the thermal interface material 330 may be required to be filled with more than the space S2 between the first part 321 and the surface of the first electronic component 310 facing the first part 321, among the spaces S1 between the first surface 251 and the first shield can 320, in order for the thermal interface material 330 to contact the first electronic component 310. For example, when the first electronic component 310 includes electronic components 311, 312, and 313 having different sizes, the thermal interface material 330 may occupy a space between the surface of the electronic component having the smallest size among the first electronic components 310 and the first part 321. For example, as illustrated in FIG. 4C, in a state of being disposed on the first surface 251, the first electronic component 310 may include electronic components 311, 312, and 313 having different heights in a direction (e.g., −z direction) from the first surface 251 toward the first part 321. For example, the electronic component 311 may have the highest height, and the electronic component 313 may have the lowest height. In order for the thermal interface material 330 to contact at least partially electronic components 311, 312, and 313 having different heights, the thermal interface material 330 may be filled in the shield can 320 to contact an electronic component having the lowest height (e.g., the electronic components 313). The amount of thermal interface material 330 injected into the shield can 320 may be greater than or equal to the amount capable of contacting at least partially the electronic component 313. When the thermal interface material is filled with enough to contact a side of the electronic component 313 having the lowest height, the electronic components 311 and 312 having a height higher than the electronic component 313 may at least partially contact the thermal interface material 330. However, it is not limited thereto. For example, the thermal interface material 330 may entirely fill the space S1 between the first surface 251 and the shield can 320.

According to an example, as the space S1 between the first surface 251 and the first shield can 320 is at least partially filled by the thermal interface material 330, heat generated from the first electronic component 310 may be diffused in a wide range. For example, when the thermal interface material 330 is applied only to a surface of the first electronic component 310 facing the first part 321, heat generated from the first electronic component 310 may not be diffused smoothly. According to an example, the thermal interface material 330 at least partially filled in the space S1 may at least partially cover a side surface of the first electronic component 310 in addition to the surface of the first electronic component 310. Since a contact area between the thermal interface material 330 and the first electronic component 310 may be increased, heat generated from the first electronic component 310 may be easily diffused to the thermal interface material 330. Since heat generated from the first electronic component 310 may be easily diffused to the space S1 through the thermal interface material 330, an increase in a temperature of the electronic device 101 may be suppressed.

According to an example, the first through hole 253 formed on the printed circuit board 250 may be used as a passage for inserting a nozzle (e.g., the nozzle 400 of FIG. 4B) or as a heat emitting passage after a mounting process of the first electronic component 310 and the first shield can 320. For example, a process of mounting the first electronic component 310 and the first shield can 320 on the printed circuit board 250 using a surface mounted technology (SMT) may be performed at high temperature. Since the mounting process is performed at high temperature, after the process is completed, it may be necessary to emit heat inside the space S1 covered by the first surface 251 and the first shield can 320 to the outside. After the heat in the space S1 is emitted to the outside of the first shield can 320, the sealing member 340 may be disposed, and injection of the thermal interface material 330 may be performed. When the space S1 between the first surface 251 and the first shield can 320 and an external space of the first shield can 320 are not connected to each other, it may be difficult to emit the heat. Since it is difficult to emit the heat, a cooling time may take a long time. According to an example, since the printed circuit board 250 includes the first through hole 253 facing the first shield can 320, heat generated in the process may be emitted to the outside of the space S1 through the first through hole 253.

Figure 5A:
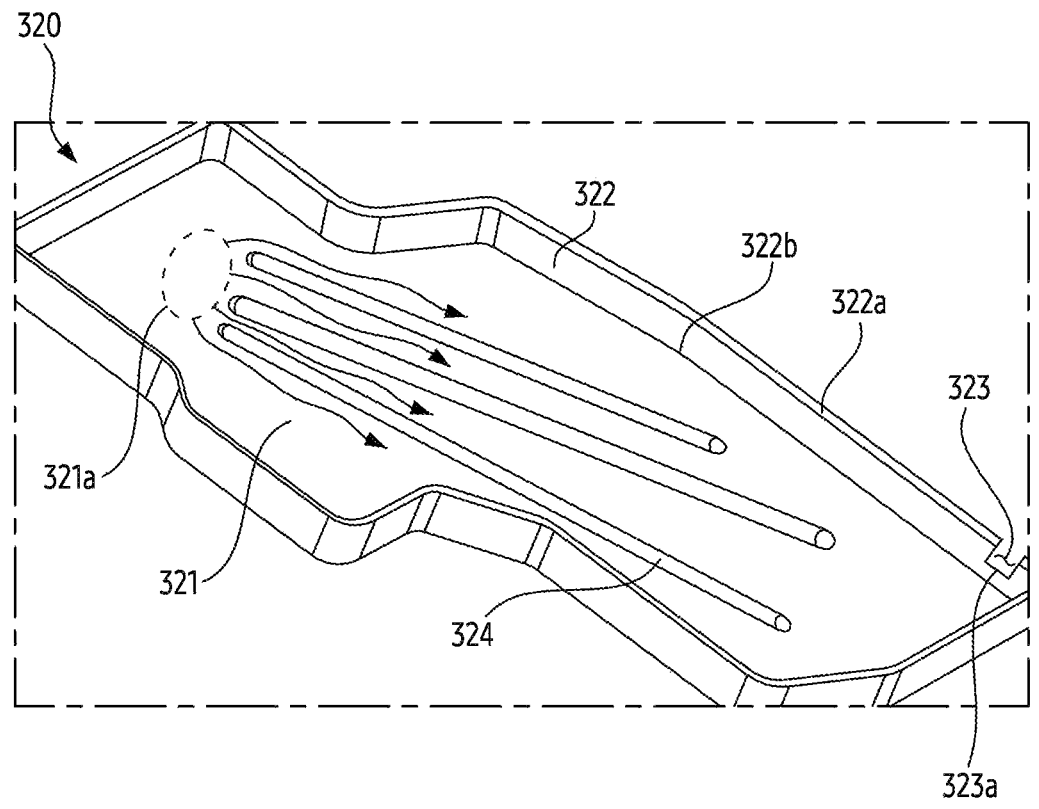
FIGS. 5A and 5B are a perspective view of an exemplary first shield can.
Figure 12:
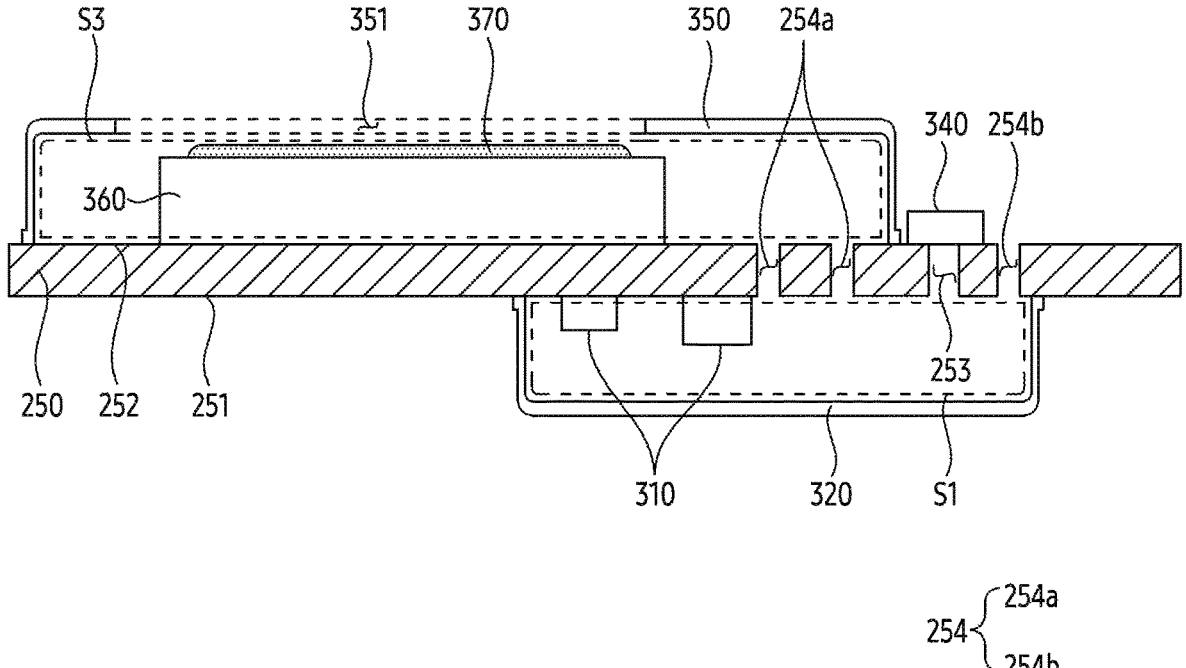
FIG. 12 illustrates an example of a printed circuit board cut along line A-A' in FIG. 10A.

According to an example, a space S1 between the first surface 251 and the shield can 320 may be connected to an external space of the shield can 320, through at least one opening part (e.g., a first opening 323 of FIG. 5A, a third through hole 254*a* and/or a fourth through hole 254*b* of FIG. 12). The internal space S1 of the first shield can 320 is connected to the external space of the first shield can 320 through the at least of opening part 323, 254*a*, and 254*b*, so that ventilation may be performed between an internal space of the first shield can 320 and the external space of the first shield can 320. Heat generated during the mounting process may be emitted to the outside of the first shield can 320 through at least one opening part 323, 254*a*, and 254*b* connected to the external space of the first shield can 320. After the mounting process is completed, a temperature inside the first shield can 320 may be lowered by ventilation through the at least one opening part 323, 254*a*, and 254*b*. Hereinafter, examples of the at least one opening part 323, 254*a*, and 254*b* will be introduced.

Figure 5B:
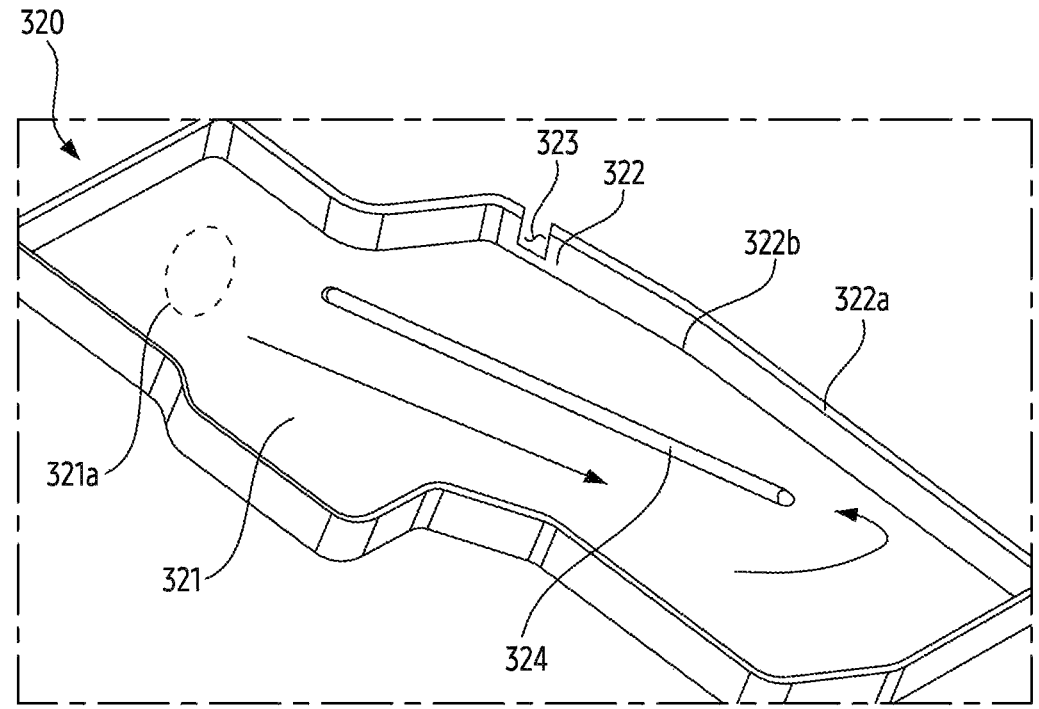

FIGS. 5A and 5B are a perspective view of an exemplary first shield can.

Referring to FIG. 5A, a first shield can 320 may include a first opening 323. As described above, heat may be generated during a mounting process. The heat may be emitted to the outside of the first shield can 320 through the first opening 323.

For example, the second part 322 may include a first periphery 322*a* and a second periphery 322*b*. The first periphery 322*a* may be in contact with a first surface (e.g., the first surface 251 of FIG. 4A) of a printed circuit board (e.g., the printed circuit board 250 of FIG. 4A). The second periphery 322*b* may be a periphery that is in contact with the first part 321 facing the first surface 251. A height of the first opening 323 may be lower than a height of the second part 322. For example, the first opening 323 may be recessed from the first periphery 322*a* to between the first periphery 322*a* and the second periphery 322*b*. The height of the first opening 323 may be lower than the height of the second part 322. Since an internal space S1 of the first shield can 320 is connected to an external space of the first shield can 320 by the first opening 323, ventilation between the internal space of the first shield can 320 and the external space of the first shield can 320 may be performed. Heat generated during the mounting process may be emitted to the outside of the first shield can 320 through the first opening 323 connected to the external space of the first shield can 320. After the mounting process is completed, a temperature inside the first shield can 320 may be lowered by the ventilation through the first opening 323.

According to an example, an end portion 323*a* of the first opening 323 may be positioned between the first periphery 322*a* and the second periphery 322*b*. For example, in case that the first opening 323 is formed from the first periphery 322*a* to the second periphery 322*b*, when a thermal interface material (e.g., the thermal interface material 330 of FIG. 4B) is injected into the first shield can 320, the thermal interface material 330 may leak out of the first shield can 320. As illustrated in FIG. 4*b*, a nozzle 400 may pass through a side of a first through hole 253 formed on a second surface 252, and may be inserted into the space S1 through another side of the first through hole 253 formed on a first surface 251. The thermal interface material 330 discharged from the nozzle 400 may be filled in a direction (e.g., +z direction) from the first part 321 toward the first surface 251. As illustrated in FIG. 5A, when the end portion 323*a* of the first opening 323 is formed up to the first periphery 322*a*, the thermal interface material 330 discharged to the first part 321 may flow to the first opening 323 along the first part 321, and may leak out of the first shield can 320 through the first opening 323. According to an example, as the end portion 323*a* of the first opening 323 is formed between the first periphery 322*a* and the second periphery 322*b*, the thermal interface material 330 may not leak out of the first shield can 320.

According to an example, the first opening 323 may be spaced apart from a partial area 321*a* of the first shield can 320 corresponding to a through hole (e.g., the first through hole 253 of FIG. 4B). For example, the first through hole 253 may face the partial area 321*a* of the first part 321. For example, the partial area 321*a* may include an area facing the first through hole 253. Since the thermal interface material 330 discharged from a nozzle (e.g., the nozzle 400 of FIG. 4B) is filled with the internal space of the first shield can 320 from the partial area 321*a*, when the first opening 323 is adjacent to the partial area 321*a*, the amount of the thermal interface material 330 capable of being injected into the first shield can 320 may be limited. For example, when the thermal interface material 330 is filled from the second periphery 322*b* to more than the end portion 323*a* of the first opening 323, the thermal interface material 330 may leak out of the first shield can 320 through the first opening 323. Since a space adjacent to the first through hole 253 may be first filled by the thermal interface material 330 in case that the first opening 323 is spaced far away from the partial area 321*a*, a relatively large amount of the thermal interface material 330 may be injected into the first shield can 320. For example, the first opening 323 may be formed at a point where a distance between a periphery of the partial area 321*a* and the second periphery 322*b* is more than a certain distance, but is not limited thereto. According to an example, a height of the first opening 323 may be limited to contact the thermal interface material 330 filled inside the first shield can 320 with the first electronic component (e.g., the first electronic component 310 of FIG. 4A). For example, a height of the first opening 323 may be lower than a height of the first electronic component 310. However, it is not limited thereto.

Referring to FIG. 5A, an exemplary first shield can 320 may include at least one first protrusion 324. The at least one first protrusion 324 may guide a flow of the thermal interface material 330 so that the thermal interface material 330 injected into the first shield can 320 may be evenly spread to an internal space of the first shield can 320. For example, a thermal interface material (e.g., the thermal interface material 330 of FIG. 4B) discharged through a nozzle (e.g., the nozzle 400 of FIG. 4B) may be in a semi-solid or liquid state with fluidity before hardening. The thermal interface material 330 may be discharged to the partial area 321a of the first part 321a facing a through hole (e.g., the first through hole 253 of FIG. 4A) and then flow along the first part 321 to fill the internal space of the first shield can 320.

According to an example, in order to guide a flow of the thermal interface material 330, at least one first protrusion 324 may extend from the partial area 321a of the first part 321 facing the first through hole 253 to another area facing a first electronic component (e.g., the first electronic component 310 of FIG. 5A). For example, the at least one first protrusion 324 may extend in a longitudinal direction of the shield can 320. The longitudinal direction of the shield can 320 may include a direction extending along the first part 321 of the shield can. For example, the at least one first protrusion 324 may extend from a position adjacent to the partial area 321a of the first part 321. For example, the position may be located within the partial area 321a or within a certain distance from the partial area 321a. For example, the at least one first protrusion 324 may extend from the position toward a position facing the first electronic component 310. Since the thermal interface material 330 is intensively filled in a space adjacent to the partial area 321a in case of absence of the at least one first protrusion 324, it may not be substantially evenly spread in the internal space of the first shield can 320. According to an example, the thermal interface material 330 discharged through the nozzle 400 may flow substantially evenly inside the first shield can 320 along the at least one first protrusion 324. The thermal interface material 330 may fill the internal space of the first shield can 320 within an area capable of contacting the first electronic component 310.

Referring to FIG. 5B, the at least one first protrusion 324 may be disposed between the first opening 323 and the partial area 321a of the first part 321 facing the through hole (e.g., the first through hole 253 of FIG. 4B). For example, the at least one first protrusion 324 may be configured such that a flow of the thermal interface material (e.g., the thermal interface material 330 of FIG. 4B) is formed from the partial area 321a to the first opening 323, by separating the partial area 321a and the first opening 323. For example, the thermal interface material 330 may flow inside the first shield can 320 along the at least one first protrusion 324 after being discharged to the partial area 321a. Since the at least one first protrusion 324 is disposed between the partial area 321a and the first opening 323, the thermal interface material 330 may flow along the at least one first protrusion 324 without flowing directly to the first opening 323. As the thermal interface material 330 is continuously injected, the thermal interface material 330 may bypass the at least one first protrusion 324 and flow toward the first opening 323.

Since an area adjacent to the first opening 323 is filled last, leakage of the thermal interface material 330 through the first opening 323 may be reduced. According to an example, a first opening 323 is illustrated in FIGS. 5A and 5B, but is not limited thereto. For example, the first openings 323 may be plural.

Figure 6:
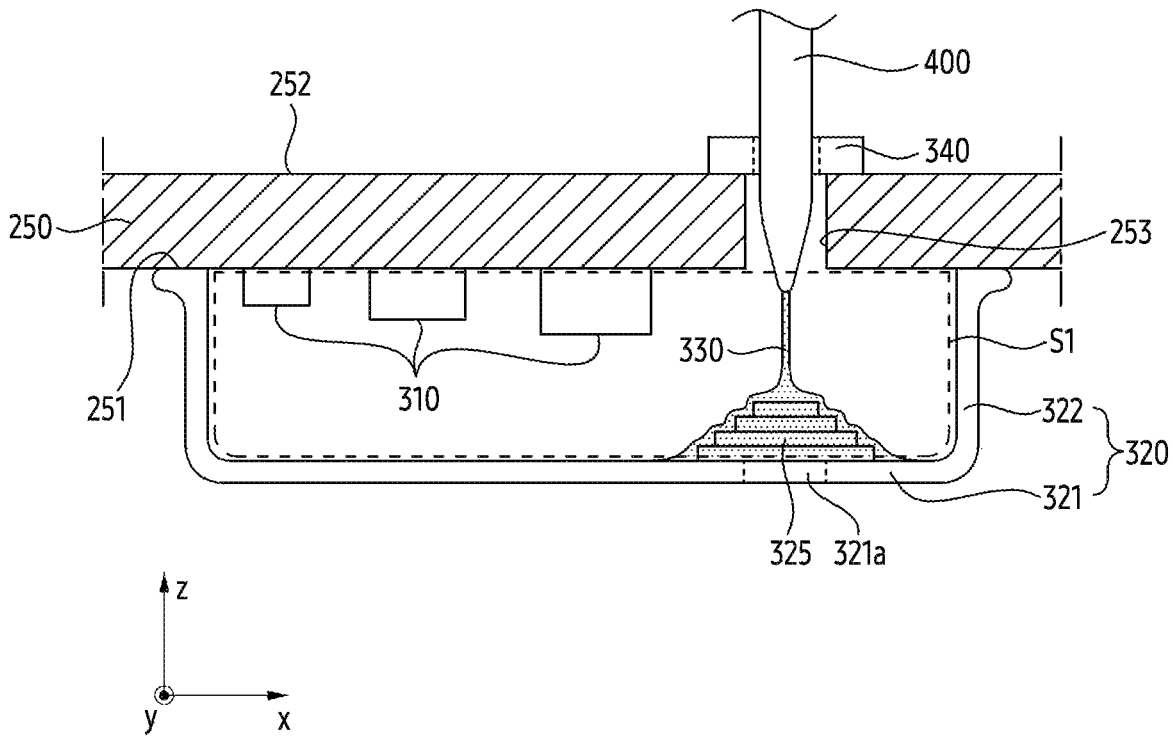
FIG. 6 illustrates an exemplary printed circuit board and first shield can.

FIG. 6 illustrates an exemplary printed circuit board and first shield can.

Referring to FIG. 6, an exemplary first shield can 320 may include a second protrusion 325. For example, the second protrusion 325 may extend from a partial area 321a of a first part 321 facing a first through hole 253 in a direction (e.g., +z direction) toward a first surface 251.

According to an example, a nozzle 400 may be inserted into a space S1 between the first surface 251 and the first shield can 320 through the first through hole 253. When a thermal interface material 330 is discharged from the nozzle 400, the thermal interface material 330 may be discharged to the partial area 321a facing the first through hole 253. As the thermal interface material 330 in a semi-solid state or liquid state flows from the area 321a to the space S1, the space S1 may be at least partially filled with the thermal interface material 330. According to an example, the second protrusion 325 may be formed in the partial area 321a such that the thermal interface material 330 flows substantially evenly in the space S1.

As illustrated in FIG. 6, the second protrusion 325 may extend from the partial area 321a toward the first surface 251. Since the thermal interface material 330 may not flow smoothly in the space S1 in case that viscosity of the thermal interface material 330 is low, the thermal interface material 330 discharged from the nozzle 400 may be concentrated in a space adjacent to the partial area 321a. The second protrusion 325 may have an inclination so that the thermal interface material 330 may flow to the entire area of the first part 321. The second protrusion 325 may have an area that becomes narrow according to the height. For example, the second protrusion 325 may be stepped. The thermal interface material 330 discharged from the nozzle 400 may have increased fluidity in a direction (e.g., −z direction) of gravity while flowing along a slope of the second protrusion 325, and may flow to the entire area of the first part 321 based on the fluidity. The thermal interface material 330 may flow over the entire area of the first part 321 and fill the space S1 between the first surface 251 and the first shield can 320. By the second protrusion 325, the thermal interface material 330 may not be concentrated in the partial area 321a, but may entirely fill the space S1.

Figure 7:
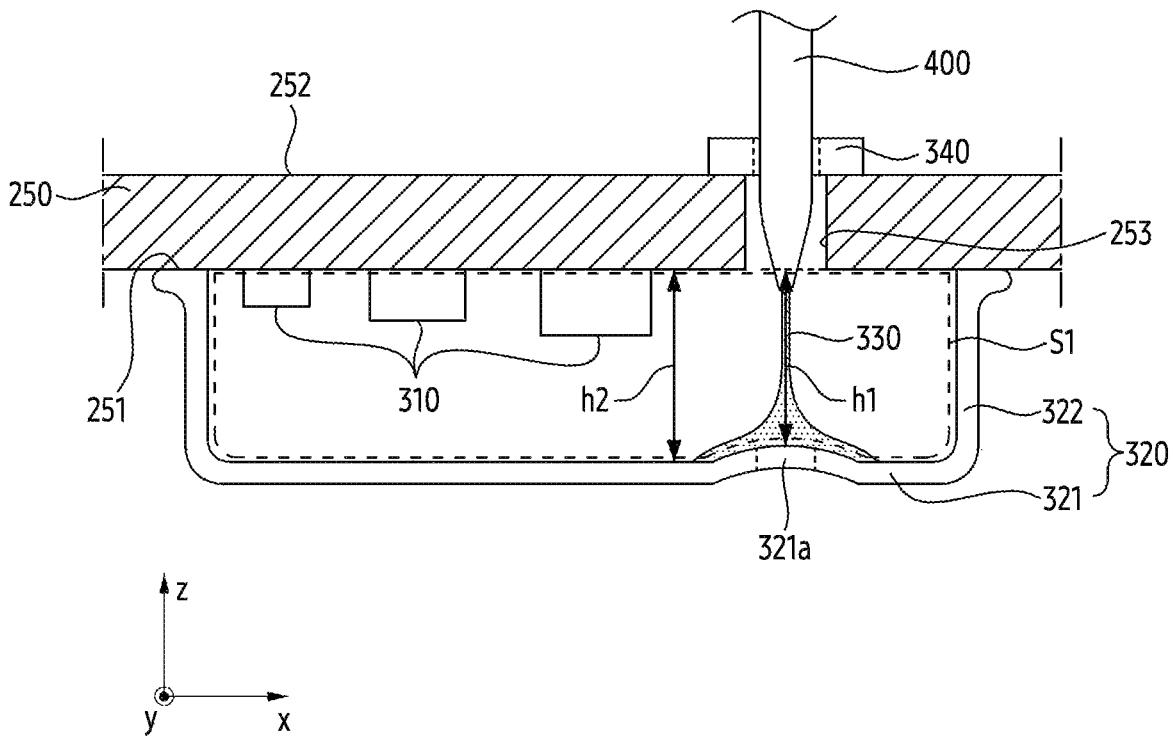
FIG. 7 illustrates an exemplary printed circuit board and first shield can.

FIG. 7 illustrates an exemplary printed circuit board and first shield can.

Referring to FIG. 7, at least a part of a first shield can 320 may be inclined so that a thermal interface material 330 discharged from a nozzle 400 may spread to a space S1 between a first surface 251 and the first shield can 320. For example, at least a part of the first part 321 may have a slope.

According to an example, the nozzle 400 may be inserted into the space S1 between the first surface 251 and the first shield can 320 through a first through hole 253. When the thermal interface material 330 is discharged from the nozzle 400, the thermal interface material may be discharged into the partial area 321a facing the first through hole 253. As the thermal interface material 330 in a semi-solid state or a liquid state flows from the area 321a to the space S1, the space S1 may be at least partially filled with the thermal interface material 330. According to an example, the partial area 321a may be inclined so that the thermal interface material 330 flows substantially evenly in the space S1.

For example, the partial area 321*a* may be recessed toward the first surface 251. As illustrated in FIG. 7, a height h1 from a point in the partial area 321*a* to the first surface 251 may be lower than a height h2 from a point in another area of the first part 321 spaced apart from the area to the first surface 251. The thermal interface material 330 discharged from the nozzle 400 may flow along a slope formed in the partial area 321*a*. The thermal interface material 330 may flow from the partial area 321*a* to the entire area of the first part 321*a* along the slope. The thermal interface material 330 may flow over the entire area of the first part 321 and fill the space S1 between the first surface 251 and the first shield can 320. Due to a height difference between the partial area 321*a* and another area, the thermal interface material 330 may not be concentrated in the partial area 321*a* and may fill the space S1 as a whole.

Figure 8:
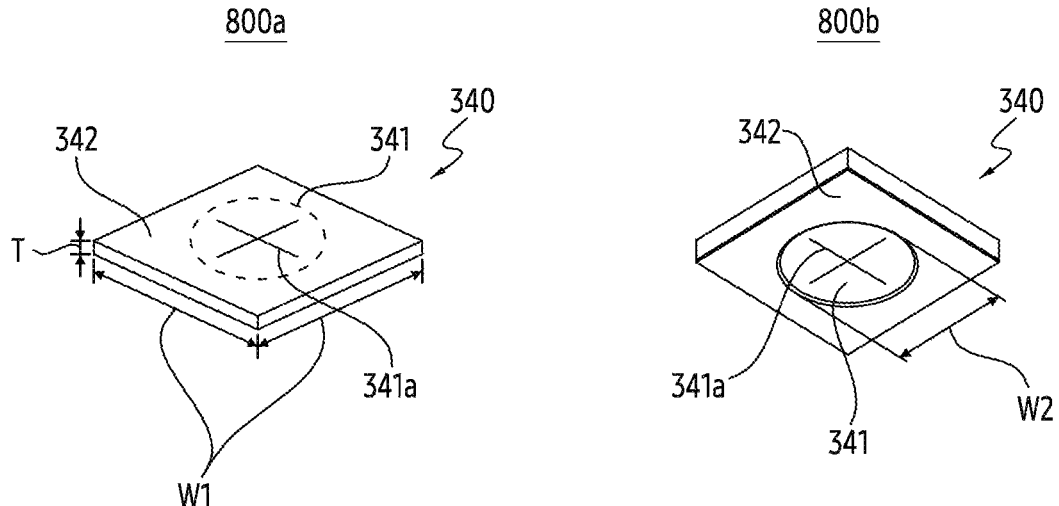
FIG. 8 illustrates an exemplary sealing member.

FIG. 8 illustrates an exemplary sealing member. 800*a* of FIG. 8 is a front perspective view of a sealing member 340, and 800*b* is a rear perspective view of the sealing member 340.

Referring to FIG. 8, the exemplary sealing member 340 may include an insertion area 341 and a flange area 342. For example, the insertion area 341 may be an area that allows insertion of a nozzle (e.g., the nozzle 400 of FIG. 4B), and the flange area 342 may be an area attached to a printed circuit board (e.g., the printed circuit board 250 of FIG. 4B) and supporting the sealing member 340. For example, a thickness T of the sealing member 340 may be about 0.30 mm, and a width W1 of the sealing member 340 may be about 2.60 mm. For example, a width W2 of the insertion area 341 may be about 1.80 mm. However, it is not limited thereto.

According to an example, the flange area 342 may be coupled to a second surface (e.g., the second surface 252 of FIG. 4B) of the printed circuit board 250. For example, the insertion area 341 may face a through hole (e.g., the first through hole 253 of FIG. 4B), and the flange area 342 may be configured to support the insertion area 341 by being coupled to the second surface 252. For example, the flange area 342 may be soldered on the second surface 252 or attached to the second surface 252 through an adhesive member, but is not limited thereto.

According to an example, the insertion area 341 may be configured to cover the first through hole 253 and allow insertion of the nozzle 400. For example, the shape of the insertion area 341 may correspond to the shape of the first through hole 253. For example, the insertion area 341 may have a deformable structure so that the nozzle 400 may be inserted into the first through hole 253. For example, the insertion area 341 may be partially cut by at least one slit 341*a*. When external force is not applied to the insertion area 341, the insertion area 341 may cover the first through hole 253. When external force is applied to the insertion area 341, the insertion area 341 may be opened in a direction in which the external force is applied through the at least one slit 341*a*. When the nozzle 400 is inserted into the insertion area 341, the nozzle 400 may penetrate the insertion area 341 while pushing the insertion area 341 through at least one slit 341*a*. When the nozzle 400 is extracted, a shape of the insertion area 341 may be restored. When the injection of thermal interface material 330 is completed, the nozzle 400 may be extracted, and the insertion area 341 may cover the first through hole 253 by being restored in a state in which the external force is not applied. The sealing member 340 may reduce the injected thermal interface material 330 from flowing back through the first through hole 253. For example, the insertion area 341 may include a material having elasticity (e.g., rubber).

The above-described example has been described as an example in which the nozzle 400 is inserted in a state in which the sealing member 340 is disposed, but is not limited thereto. For example, in a state in which the sealing member 340 is not disposed, the first through hole 253 may be exposed to the outside. In a state in which the sealing member 340 is not disposed, the nozzle 400 may pass through the first through hole 253 and inject the thermal interface material 330. The sealing member 340 may cover the first through hole 253 by being disposed on the first through hole 253 after the injection of the thermal interface material 330 is completed and the nozzle 400 is extracted.

According to an example, the sealing member 340 may be omitted according to an amount of the thermal interface material 330 injected. For example, when the amount of the thermal interface material 330 smaller than the volume of a space (e.g., the space S1 of FIG. 4A) between the first surface 251 and the shield can 320 is injected, the thermal interface material 330 may be difficult to flow back through the first through hole 253. In the above-described case, since the thermal interface material 330 is unlikely to flow back, the sealing member 340 may be omitted.

Figure 9:
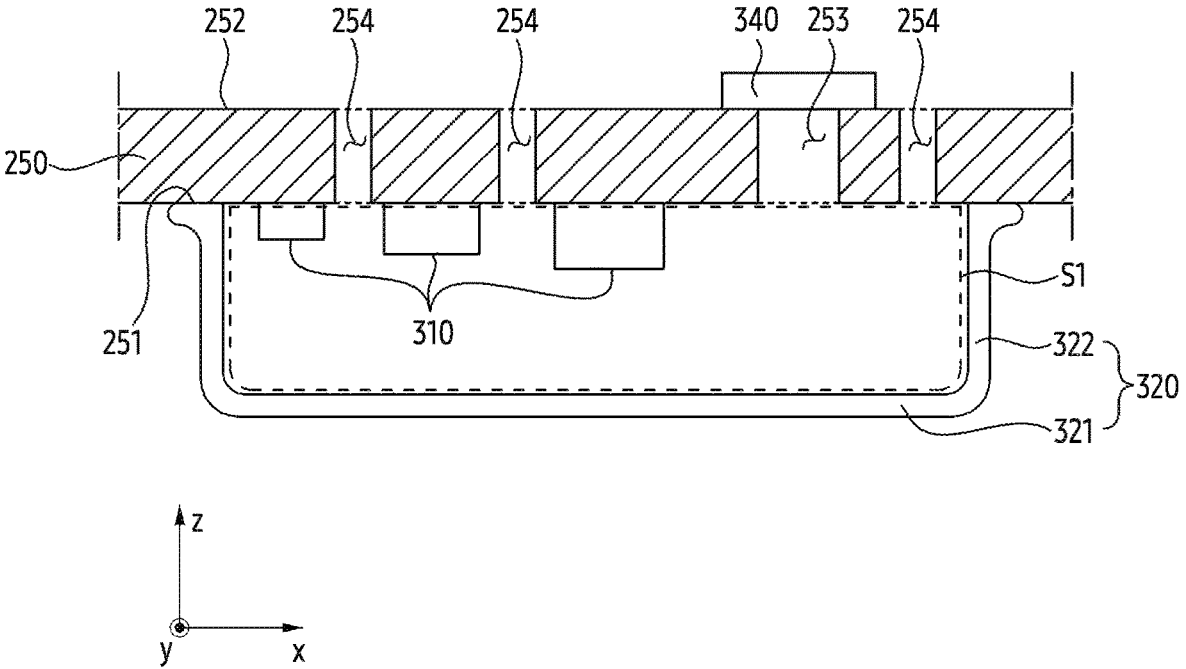
FIG. 9 illustrates an exemplary printed circuit board and first shield can.

FIG. 9 illustrates an exemplary printed circuit board and first shield can.

Referring to FIG. 9, a printed circuit board 250 may further include a second through hole 254 spaced apart from a first through hole 253 used as an insertion passage for a nozzle (e.g., the nozzle 400 of FIG. 4B).

According to an example, while a mounting process is performed at a high temperature, a temperature of a space S1 between a first surface 251 and a first shield can 320 may increase. After the mounting process is completed, the increased temperature may be lowered through ventilation between the space S1 and an external space of the first shield can 320. When the printed circuit board 250 includes only the first through hole 253 used as an insertion passage for the nozzle 400, ventilation for discharging heat may be insufficient. Since the nozzle 400 is inserted in a direction (e.g., −z direction) from a second surface 252 toward the first surface 251 through the first through hole 253, the thermal interface material 330 discharged from the nozzle 400 may be filled from a bottom (e.g., the first part 321) of the first shield can 320. When a hole for ventilation is formed in the first part 321, the thermal interface material 330 may flow out of the first shield can 320.

According to an example, the printed circuit board 250 may further include the second through hole 254 for ventilation. The second through hole 254 may face the first shield can 320. When the second surface 252 of the printed circuit board 250 is viewed from above, the second through hole 254 may face the first shield can 320. For example, the second through hole 254 may be plural. Since air in an internal space of the first shield can 320 flows to an external space of the first shield can 320 through the second through hole 254, ventilation may be performed smoothly. After the mounting process is completed, a temperature inside the first shield can 320 may be lowered by ventilation through the second through hole 254.

According to an example, when the printed circuit board 250 includes the second through hole 254 facing the first shield can 320, the thermal interface material 330 may fill the space S1 between the first surface 251 and the first shield can 320. For example, as illustrated in FIG. 5A, when the first shield can 320 includes an opening (e.g., the opening 323 of FIG. 5A) for ventilation, an amount of the thermal interface material 330 capable of being injected into the space S1 may be limited. For example, the thermal interface material 330 may be filled from the first part 321 to an end portion (e.g., the end portion 323*a* of FIG. 5A) of the opening 323. As illustrated in FIG. 9, in a case of the printed circuit board 250 including the second through hole 254, since ventilation is possible through the second through hole 254, the thermal interface material 330 may be filled from the first part 321 to the first surface 251. According to an example, as the amount of the thermal interface material 330 capable of being injected into the space S1 increases, heat generated from the first electronic component 310 may be smoothly diffused. Since the heat is smoothly diffused, a temperature increase of an electronic device (e.g., the electronic device 101 of FIG. 2) may be suppressed.

The electronic device 101 described with reference to FIGS. 3, 4A to 4C, 5A, 5B, and 6 to 9 is described as a structure in which a first electronic component 310 is disposed on a surface (e.g., the first surface 251) of the printed circuit board 250, but is not limited thereto. For example, electronic components may be disposed on each of both surfaces (e.g., the first surface 251 and the second surface 252) of the printed circuit board 250.

Hereinafter, a structure in which electronic components are disposed on each of both surfaces of the printed circuit board 250 will be described with reference to drawings. Components to be described later may be implemented together with the components described with reference to FIGS. 3, 4A to 4C, 5A, 5B, and 6 to 9. In describing an example, the same reference numerals are assigned to the same components, and overlapping descriptions may be omitted.

Figure 10A:
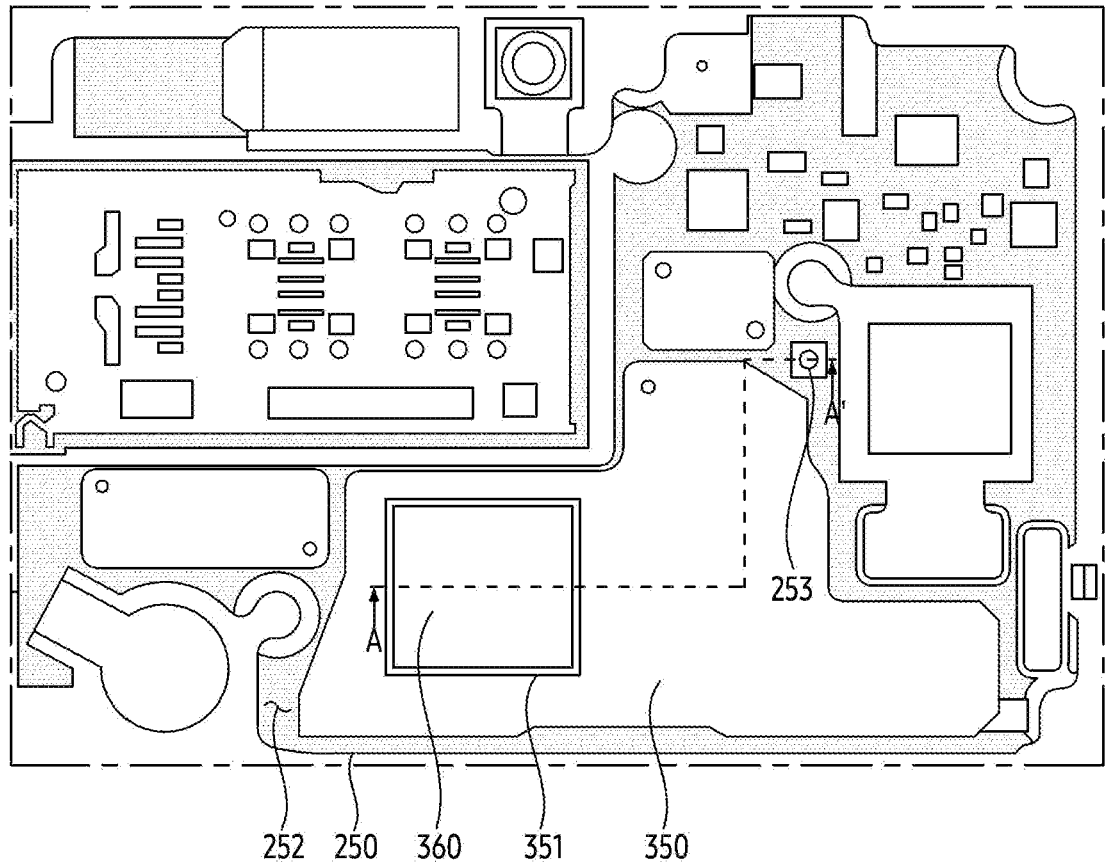
FIG. 10A is a diagram looking at a second surface of an exemplary printed circuit board.
Figure 10B:
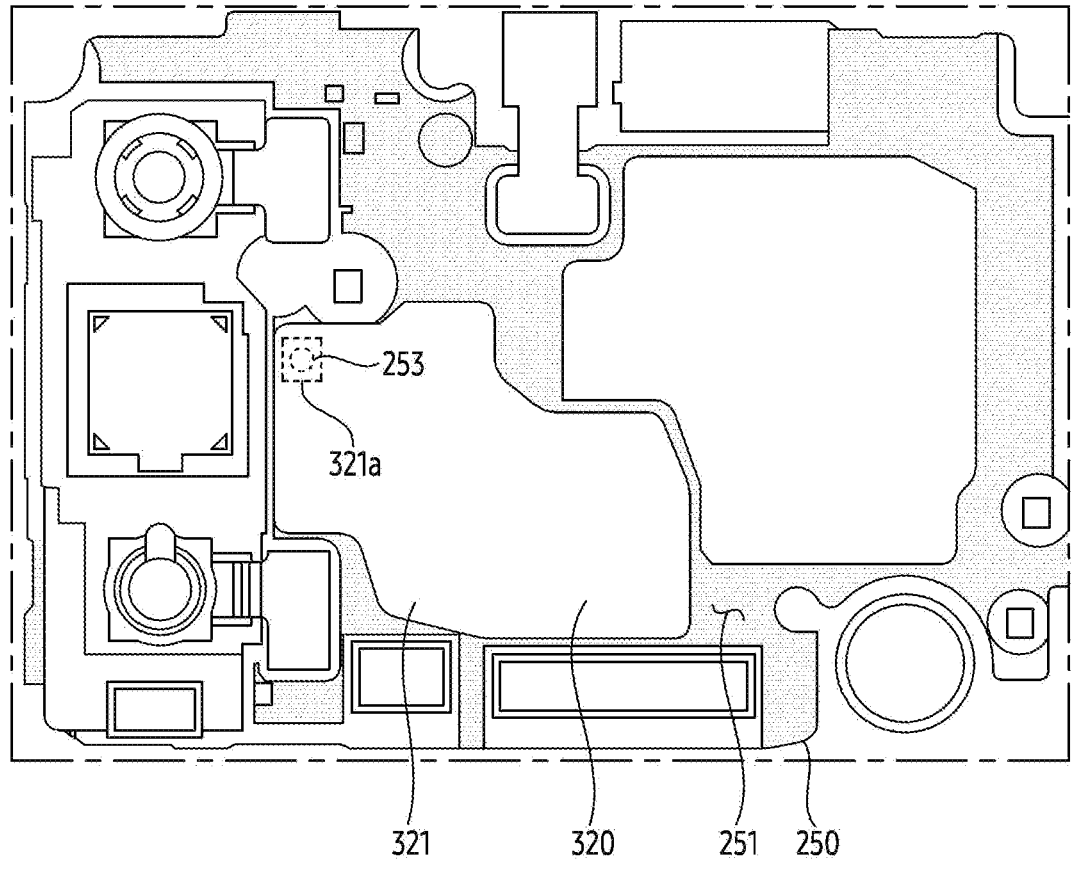
FIG. 10B is a diagram looking at a first surface of an exemplary printed circuit board.
Figure 10C:
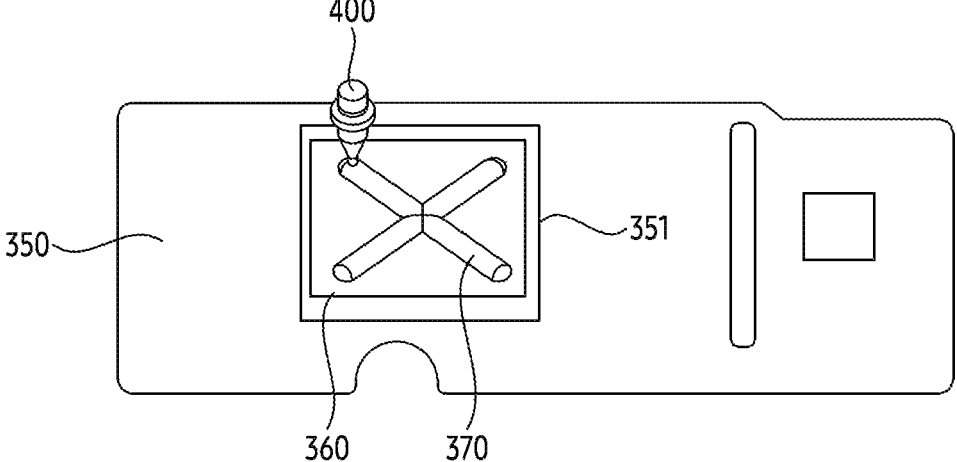
FIG. 10C illustrates an exemplary state in which a thermal interface material is applied to a second electronic device inside a second shield can.

FIG. 10A is a diagram looking at a second surface of an exemplary printed circuit board. FIG. 10B is a diagram looking at a first surface of an exemplary printed circuit board. FIG. 10C illustrates an exemplary state in which a thermal interface material is applied to a second electronic device inside a second shield can.

Referring to FIG. 10A, an exemplary electronic device (e.g., the electronic device 101 of FIG. 2) may further include a second electronic component 360 and a second shield can 350. For example, the second electronic component 360 may be disposed on a second surface 252 of a printed circuit board 250. For example, the second shield can 350 is disposed on the second surface 252 and may cover the second electronic component 360. For example, the second electronic component 360 may include a processor (e.g., the processor 120 of FIG. 1). However, it is not limited thereto.

According to an example, the second shield can 350 may include a third opening 351 aligned with the second electronic component 360. For example, when the second shield can 350 is viewed from above, the third opening 351 and the second electronic component 360 may at least partially face each other. The third opening 351 may provide a path through which heat generated from the second electronic component 360 is emitted to the outside of the second shield can 350. For example, when the second shield can 350 does not include the third opening 351, heat generated from the second electronic component 360 may not be emitted to the outside of the second shield can 350 and may remain inside the second shield can 350. Since the heat remains inside the second shield can 350, an increase in a temperature of the second electronic component 360 may be caused. As the third opening 351 is aligned with the second electronic component 360, the heat generated from the second electronic component 360 may be emitted to the outside of the second shield can 350 through the third opening 351.

According to an example, a first through hole 253 may be exposed on the second surface 252 so that a nozzle (e.g., the nozzle 400 of FIG. 4B) may be injected. For example, the first through hole 253 may be spaced apart from the second shield can 350. Referring to FIG. 10B, when looking at the first surface 251, the first through hole 253 may not be visible by facing the first shield can 320. A thermal interface material (e.g., the thermal interface material 330 of FIG. 4B) may at least partially fill the inside of the first shield can 320 after being discharged to a partial area 321*a* of a first part 321 facing the first through hole 253. Although not illustrated, a sealing member 340 (e.g., the sealing member 340 of FIG. 11) may cover the first through hole 253 by being disposed on the second surface 252.

Referring to FIG. 10C, a thermal interface material 370 may be applied on the second electronic component 360 disposed in the second shield can 350. For example, the second electronic component 360 may be exposed to the outside through the third opening 351. The nozzle 400 may apply the thermal interface material 370 to a surface of the second electronic component 360 exposed through the third opening 351. For example, the nozzle 400 may emit the thermal interface material 370 while moving along a partial area of the surface of the second electronic component 360. Although not illustrated, after the thermal interface material 370 is applied, a shielding sheet may cover the third opening 351. According to an example, a physical property of the thermal interface material 370 applied on the second electronic component 360 may be different from a physical property of a thermal interface material 330 injected into a space S1 between the first surface 251 and the first shield can 320. For example, a flowability of the thermal interface material 370 applied on the second electronic component 360 may be different from a flowability of the thermal interface material 330 injected into the space S1 between the first surface 251 and the first shield can 320. For example, the thermal interface material 370 applied on the second electronic component 360 may have a relatively high viscosity to maintain a state applied to the surface of the second electronic component 360. For example, the thermal interface material 330 injected into the space S1 between the first surface 251 and the first shield can 320 may have a relatively low viscosity to fill the space S1. For example, a viscosity of the thermal interface material 330 may be about 50,000 centi-poise (cps), and a viscosity of the thermal interface material 370 may be about 90,000 cps, but is not limited thereto. For example, the thermal interface material 370 applied on the second electronic component 360 may be in a semi-solid state. For example, the thermal interface material 330 injected into the space S1 may be in a liquid state. However, it is not limited thereto.

According to an example, a process of injecting and applying the thermal interface materials 330 and 370 may be performed as a single process. For example, as illustrated in FIG. 10A, when the second surface 252 is viewed from above, both the third opening 351 and the first through hole 253 may be exposed. A nozzle (e.g., the nozzle 400 of FIG. 10C) configured to emit the thermal interface material 330 may perform a first process of applying the thermal interface material 330 on the second electronic component 360 through the third opening 351 on the second surface 252, and a second process of injecting the thermal interface material 370 into a first shield can (e.g., the first shield can 320 of FIG. 10B) through the first through hole 253. A sequence of the first process and the second process is not limited. The nozzle 400 may perform the second process after performing the first process or the first process after performing the second process. The first process and the second process may be performed within a same arrangement state without flipping the printed circuit board 250, and thus may be performed within a single process. According to an example, since the thermal interface materials 330 and 370 may be applied and injected within a single process, the process may be simplified and a process time may be shortened.

Figure 11:
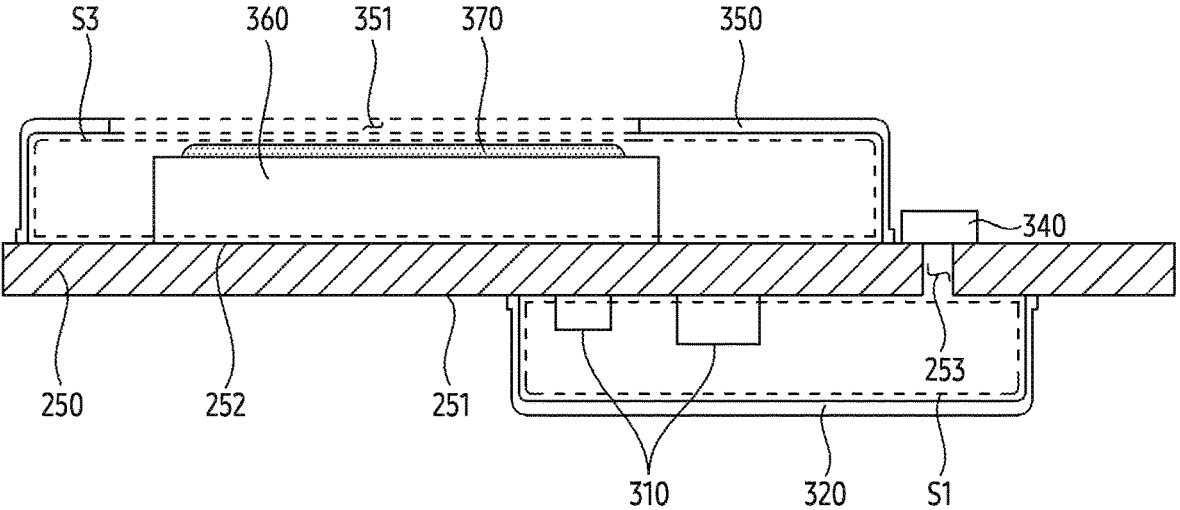
FIG. 11 illustrates an example of a printed circuit board cut along line A-A' in FIG. 10A.

FIG. 11 illustrates an example of a printed circuit board cut along line A-A' in FIG. 10A.

Referring to FIG. 11, an electronic component (e.g., a first electronic component 310 and a second electronic component 360) and a shield can (e.g., a first shield can 320 and a second shield can 350) may be disposed on both surfaces (e.g., a first surface 251 and a second surface 252) of a printed circuit board 250. For example, the first electronic component 310 and the first shield can 320 may be disposed on the first surface 251. For example, the second electronic component 360 and the second shield can 350 may be disposed on the second surface 252. The first electronic component 310 may be covered by the first shield can 320. The second electronic component 360 may be partially covered by the second shield can 350.

According to an example, the first shield can 320 and the second shield can 350 may partially face each other. For example, when the second surface 252 of the printed circuit board 250 is viewed from above, at least a part of the second shield can 350 may face at least a part of the first shield can 320.

According to an example, when the second surface 252 is viewed from above, a first through hole 253 may face the first shield can 320 and may be spaced apart from the second shield can 350. Since a nozzle (e.g., the nozzle 400 of FIG. 4B) for injecting a thermal interface material 330 into a space S1 between the first surface 251 and the first shield can 320 is inserted through the first through hole 253, the first through hole 253 may be spaced apart from the second shield can 350 in order for inserting the nozzle 400. A sealing member 340 may be disposed on the second surface 252. The sealing member 340 may cover the first through hole 253.

According to an example, while a mounting process is performed at a high temperature, a temperature of the space S1 between the first shield can 320 and the first surface 251 and a space S3 between the second shield can 350 and the second surface 252 may increase. Since the space S3 between the second shield can 350 and the second surface 252 is connected to an external space of the second shield can 350 through a third opening 351, heat in the space S3 may be emitted to the outside of the second shield can 350 by ventilation through the third opening 352. Heat in the space S1 between the first shield can 320 and the first surface 251 may be emitted to the outside of the first shield can 320 by ventilation through the first through hole 253. After the temperature in the spaces S1 and S3 is lowered, the sealing member 340 may be disposed, and injection and application of the thermal interface material 330 may be performed.

FIG. 12 illustrates an example of a printed circuit board cut along line A-A' in FIG. 10A.

Referring to FIG. 12, a printed circuit board 250 may include a second through hole 254. For example, the second through holes 254 may be plural. For example, the second through hole 254 may include a third through hole 254a and a fourth through hole 254b facing a first shield can 320. When viewed from above the second surface 252, the third through hole 254a may face the first shield can 320 and a second shield can 350. When viewed from above the second surface 252, the fourth through hole 254b may face the first shield can 320 and may not face the second shield can 350.

According to an example, the second through hole 254 may be used as a heat emitting passage after the mounting process. Since the second through hole 254 faces the first shield can 320, heat in the space S1 between the first surface 251 and the first shield can 320 may be emitted to the outside of the space S1 through the second through hole 254. For example, the heat may be transferred to a space S3 between the second surface 252 and the second shield can 350 through the third hole 254a and then emitted to the outside through a third opening 351 of the second shield can 350. For example, the heat may be emitted to the outside of the first shield can 320 through the fourth through hole 254b.

Figure 13:
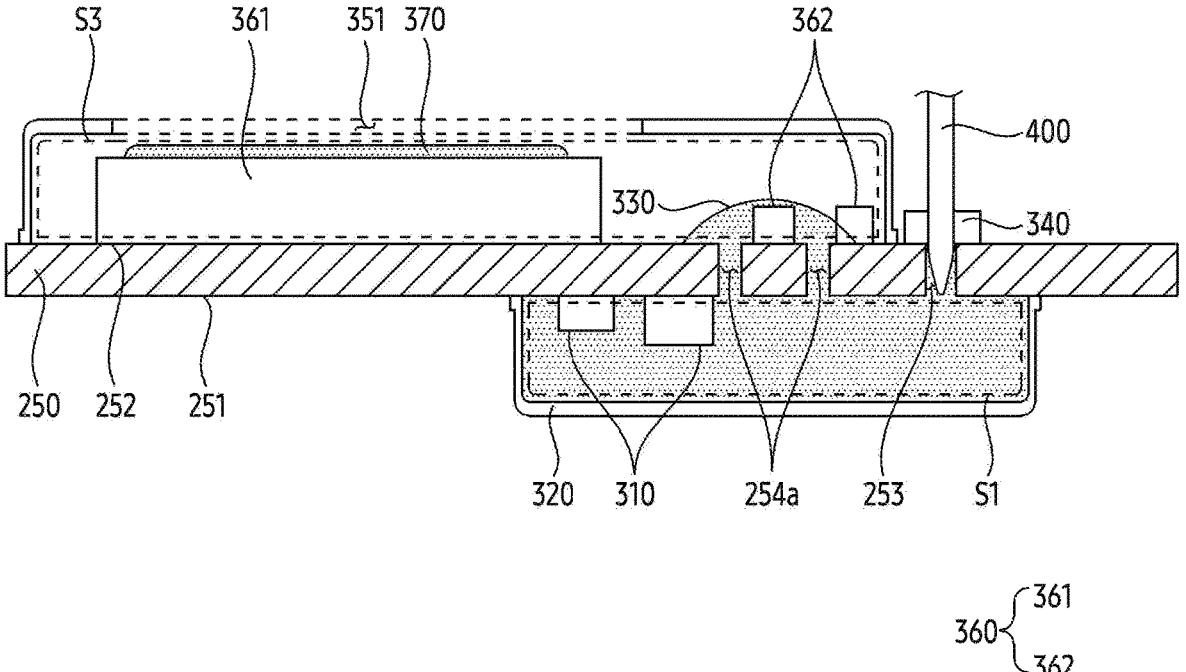
FIG. 13 illustrates an example of a printed circuit board cut along line A-A' in FIG. 10A.

FIG. 13 illustrates an example of a printed circuit board cut along line A-A' in FIG. 10A.

Referring to FIG. 13, a thermal interface material 330 may be provided from a space S1 between a first surface 251 and a first shield can 320 to a space S3 between a second surface 252 and a second shield can 350. According to an example, a third through hole 254a may be used as a transmission passage for the thermal interface material 330.

According to an example, since the thermal interface material 330 is applied on an electronic component 361 aligned with a third opening 351 among second electronic components 360 covered by the second surface 252 and the second shield can 350, in case that heat generated from an electronic component 362 that is not aligned with the third opening 351 and is spaced apart from the third opening 351 is a lot, diffusion of the heat may be required. When a separate process for filling the thermal interface material 330 in the space S3 is performed, an additional structure (e.g., a through hole for inserting a nozzle 400) for the process may be required. Alternatively, when the nozzle 400 is inserted from the first surface 251 into the second surface 252 in order to inject the thermal interface material 330 into the space S3, a process of flipping a printed circuit board 250 may be required. Due to the additional structure and/or the additional process, a manufacturing process of an electronic device (e.g., the electronic device 101 of FIG. 2) may be complicated and take more time.

According to an example, the nozzle 400 may be inserted into the space S1 between the first surface 251 and the first shield can 320 through a first through hole 253. In a state in which the nozzle 400 is inserted into the space S1, the thermal interface material 330 may be discharged from the nozzle 400. The thermal interface material 330 discharged from the nozzle 400 may be filled from a bottom of the first shield can 320 toward the first surface 251. As the thermal interface material 330 is continuously discharged, the thermal interface material 330 may fill entirely the space S1. When the space S1 is entirely filled, the thermal interface material 330 may be provided to the space S3 between the second surface 252 and the second shield can 350 through the third through hole 254a by the pressure of the nozzle 400. The thermal interface material 330 provided to the space S3 through the third through hole 254a may flow around the third through hole 254a and at least partially fill the space S3.

According to an example, the thermal interface material 330 discharged from the nozzle 400 may fill the space S1 between the first surface 251 and the first shield can 320, and then at least partially fill the space S3 between the second surface 252 and the second shield can 350. For example, among the second electronic components 360, the electronic component 362 spaced apart from the third opening 351 may contact the thermal interface material 330 transferred through the third through hole 254*a*. Heat generated from the electronic component 362 may be diffused through the thermal interface material 330 transferred through the third through hole 254*a*. According to an example, in a state in which the nozzle 400 is inserted into the first through hole 253, since at least a part of the space S1 between the first surface 251 and the first shield can 320 and the space S3 between the second surface 252 and the second shield can 350 may be filled with the thermal interface material 330, the thermal interface material 330 may be provided in both the spaces S1 and S3 in a single process. According to an example, the third through hole 254*a* may have a diameter capable of passing the thermal interface material 330. The diameter of the third through hole 254*a* of the printed circuit board 250 illustrated in FIG. 13 may be larger than a diameter of the third through hole 254*a* and/or the fourth through hole 254*b* of the printed circuit board 250 illustrated in FIG. 12. According to an example, as the thermal interface material 330 is provided to the space S3 between the second surface 252 and the second shield can 350, heat in the space S3 may be diffused, and an increase in a temperature within the space S3 may be reduced. Since the thermal interface material 330 may be provided to both the spaces S1 and S3 in a single process through a structure illustrated in FIG. 13, the process may be simplified.

Figure 14A:
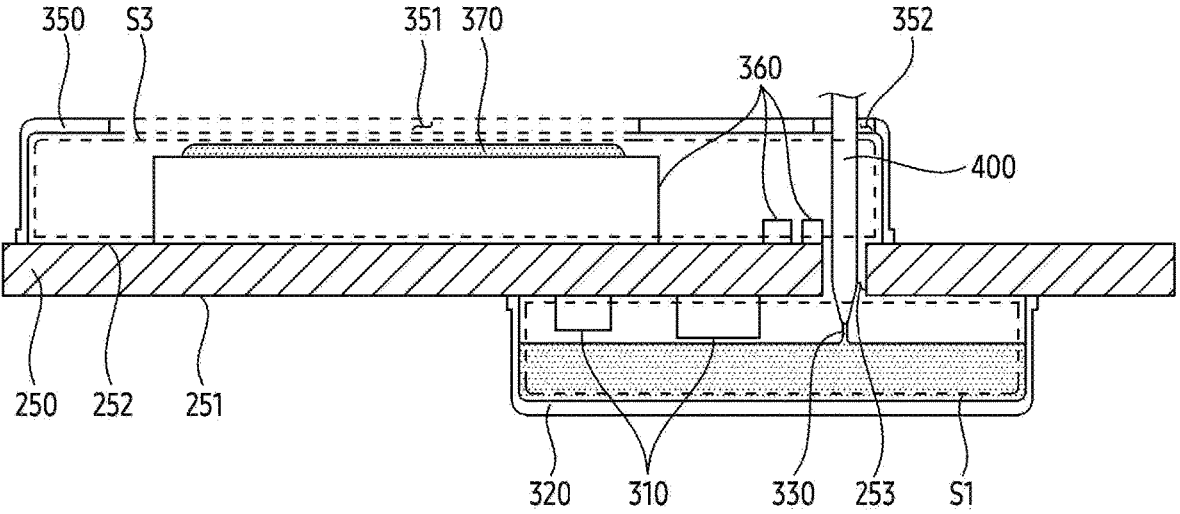
FIGS. 14A and 14B illustrate an example of a printed circuit board cut along line A-A' in FIG. 10A.
Figure 14B:
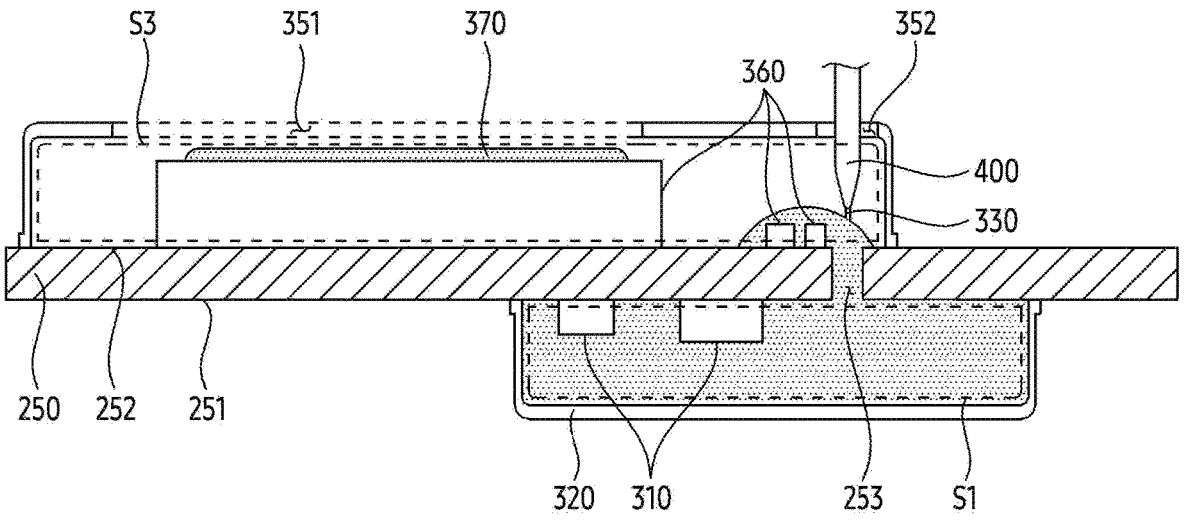
Figure 14B:
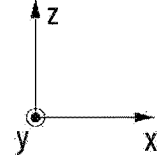

FIGS. 14A and 14B illustrate an example of a printed circuit board cut along line A-A' in FIG. 10A.

In case of an example illustrated in FIG. 13, when a thermal interface material 330 is provided from a space S1 between a first surface 251 and a first shield can 320 to a space S3 between a second surface 252 and a second shield can 350, the thermal interface material 330 may pass through a third through hole 254*a*. Since a plurality of electronic components are disposed on a printed circuit board 250, it may be difficult to form the third through hole 254*a* or to secure a diameter of the third through hole 254*a*. In order for the thermal interface material 330 to pass through the third through hole 254*a*, emission pressure of a nozzle 400 may be required to be greater than or equal to a certain pressure.

Referring to FIGS. 14A and 14B, the second shield can 350 may include a third opening 352 spaced apart from a third opening 351. According to an example, the third opening 352 may be used as a passage into which a nozzle 400 is inserted.

Referring to FIG. 14A, the third opening 352 may face a first through hole 253. For example, when the second shield can 350 is viewed from above, the third opening 352 and the first through hole 253 may at least partially face each other. The nozzle 400 may be inserted into the space S1 between the first surface 251 and the first shield can 320 through the third opening 352 and the first through hole 253 facing each other. In a state in which the nozzle 400 is inserted into the space S1, the thermal interface material 330 may be discharged from the nozzle 400. The thermal interface material 330 may fill the space S1. A first electronic component 310 disposed in the space S1 may contact the thermal interface material 330 through the process.

Referring to FIG. 14B, after the space S1 is filled, the nozzle 400 may be extracted to the space S3 between the second surface 252 and the second shield can 350. As the thermal interface material 330 is continuously discharged from the nozzle 400, the space S3 may be filled with the thermal interface material 330. As the thermal interface material 330 is filled in the space S3, a second electronic component 360 in the space S3 may contact the thermal interface material 330. After at least a part of the space S3 is filled with the thermal interface material 330, the nozzle 400 may be extracted through the third opening 352.

According to an embodiment, at least a part of the space S1 between the first surface 251 and the first shield can 320 and the space S3 between the second surface 252 and the second shield can 350 may be filled with the thermal interface material 330 through the third opening 352 facing the first through hole 253. Since the third opening 352 faces the first through hole 253, the nozzle 400 may inject the thermal interface material 330 while moving in a direction (e.g., −z direction). When the thermal interface material 330 is filled in the space S1, the nozzle 400 may move in an opposite direction (e.g., +z direction) and then inject the thermal interface material 330 into the space S3. Since the thermal interface material 330 is not required to pass through a narrow passage (e.g., the third opening 254*a* of FIG. 13) when the thermal interface material 330 is filled in the two spaces S1 and S3, the thermal interface material 330 may be filled in the two spaces S1 and S3 even when an emission pressure of the nozzle 400 is relatively low. According to an example, since a passage for the thermal interface material 330 (e.g., the third opening 254*a* of FIG. 13) is not required, a design of the printed circuit board 250 may be simplified, and various electronic components may be connected to the printed circuit board 250. Since it is not necessary to flip the printed circuit board 250 for injection of the thermal interface material 330, an additional process may not be required. According to an example, through a simple structure change of the second shield can 350 including the third opening 352, the thermal interface material 330 may be provided to both spaces S1 and S3.

Figure 15:
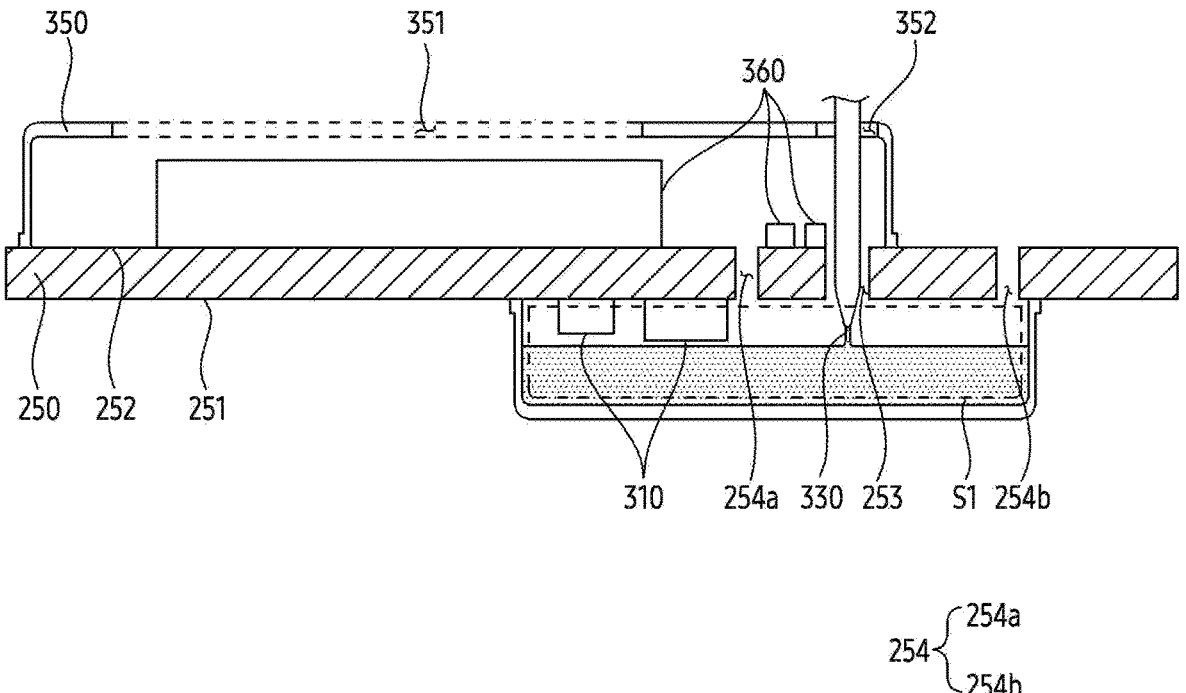
FIG. 15 illustrates an example of a printed circuit board cut along line A-A' in FIG. 10A.

FIG. 15 illustrates an example of a printed circuit board cut along line A-A' in FIG. 10A.

Referring to FIG. 15, a printed circuit board 250 may include a second through hole 254. The second through hole 254 may be spaced apart from a first through hole 253 facing a third opening 352. The second through hole 254 may include a third opening 254*a* and a fourth through hole 254*b* facing a first shield can 320. The third opening 254*a* may face each of the first shield can 320 and s second shield can 350. The fourth through hole 254*b* may face the first shield can 320 and may not face the second shield can 350.

According to an example, the second through hole 254 may be used as a heat emitting passage after a mounting process. Since the second through hole 254 faces the first shield can 320, heat in a space S1 between a first surface 251 and the first shield can 320 may be emitted to the outside of the space S1 through the second through hole 254. For example, the heat may be transferred to a space S3 between a second surface 252 and the second shield can 350 through the third opening 254*a*, and then may be emitted to the outside through a third opening 351 of the second shield can 350. For example, the heat may be emitted to the outside of the first shield can 320 through the fourth through hole 254*b*.

According to an example, at least a part of the space S1 between the first surface 251 and the first shield can 320 may be filled with the thermal interface material 330. For example, a nozzle 400 may be inserted into the space S1 through the third opening 352 and the first through hole 253. The nozzle 400 may emit the thermal interface material 330 in a state of being inserted into the space S1. The thermal interface material 330 discharged from the nozzle 400 may fill at least a part of the space S1. The nozzle 400 may be extracted through the first through hole 253 and the third opening 352 after at least a part of the space S1 is filled.

According to an example, a first electronic component 310 in the space S1 may at least partially contact the thermal interface material 330. Heat generated from the first electronic component 310 may be diffused through the thermal interface material 330. As the heat is diffused, a temperature increase in the space S1 may be reduced.

An electronic device 101 is provided. The electronic device 101 may include a printed circuit board 250 including a first surface 251, a second surface 252 opposite to the first surface 251, and a first through hole 253 passing through the first surface 251 and the second surface 252. The electronic device 101 may include a first electronic component 310 disposed on the first surface 251. The electronic device 101 may include a first shield can 320 disposed on a partial area of the first surface 251 including the first through hole 253, and covering the first electronic component 310. The electronic device 101 may include a thermal interface material 330 injected through the first through hole 253, and included in a space S1 between the first surface 251 and the first shield can 320. The first shield can 320 may include a first part 321 substantially parallel to the first surface 251, and a second part 322 extending from a periphery of the first part 321 to the first surface 251 and coupled to the first surface 251. The thermal interface material 330 at least partially may occupy a space between the first part 321 and a surface of the first electronic component 310 facing the first part 321, and be at least partially in contact with the first electronic component 310. The space S1 between the first surface 251 and the first shield can 320 may be connected to an external space of the first shield can 320 through at least one opening part 323, 254a, and 254b formed in at least one of the first shield can 320 or the printed circuit board 250. According to an example of the disclosure, a thermal interface material may diffuse heat generated from a first electronic component by at least partially filling a space between a shield can and a first electronic component. A nozzle for injecting the thermal interface material may be inserted through a through hole. A direction in which the nozzle is inserted may be a direction opposite to an arrangement direction of the shield can. When the thermal interface material is discharged from the nozzle, it may be filled from a bottom of the shield can. The thermal interface material may be injected to contact an electronic component disposed on a first surface of a printed circuit board. Since the insertion direction of the nozzle and a direction in which the thermal interface material is filled are opposite to each other, a relatively large amount of thermal interface material may be filled in a space between the shield can and the printed circuit board. The thermal interface material may suppress a temperature increase of an electronic device by diffusing heat generated from the first electronic component.

For example, the at least one opening part 323, 254a, and 254b may include a first opening 323 formed on the second part 322 of the first shield can 320 and including a periphery 322a of the first shield can 320 that contacts with the first surface 251. A height of the first opening 323 may be lower than a height of the second part 322. According to an example of the disclosure, since a space covered by a first part and a second part is connected to an external space of the shield can by the first opening, ventilation between an internal space of the shield can and an external space of the shield can may be performed. Heat generated during a mounting process may be emitted to the outside of the shield can through the first opening connected to the external space of the shield can. According to an example, as an end portion of the first opening is formed between a first periphery and a second periphery, the thermal interface material may not be leaked to the outside of the shield can through the second part between the first part and the opening. When the first opening includes a periphery of the shield can in contact with a first surface, it may mean that the opening is formed by removing the periphery.

For example, the first shield can 320 may include at least one first protrusion 324 extending from position adjacent to a partial area 321a of the first part 321 facing the first through hole 253 in a longitudinal direction of the first shield can 320. According to an example of the disclosure, at least one first protrusion may guide a flow of the thermal interface material so that the thermal interface material injected into the shield can is evenly distributed to the shield can internal space.

For example, the first shield can 320 may include a second protrusion 325 extending from a partial area 321a of the first part 321 facing the first through hole 253 toward the first surface 251. The second protrusion 325 may be stepped. According to an example of the disclosure, the thermal interface material injected into the shield can may be evenly distributed to the shield can internal space through a second protrusion.

For example, a height (e.g., the height h1 of FIG. 7) from the partial area 321a of the first part 321 facing the first through hole 253 to the first surface 251 may be lower than a height (e.g., the height h2 of FIG. 7) from another area of the first part 321 spaced from the partial area 321a to the first surface 251. According to an example of the disclosure, the thermal interface material injected into the shield can may be evenly distributed to the shield can internal space through a height difference.

For example, the electronic device 101 may further include a sealing member 340 disposed on the second surface 252 and covering the first through hole 253. The sealing member 340 may include an insertion area 341 allowing insertion of a nozzle 400 for injecting the thermal interface material 330. According to an example of the disclosure, when a nozzle is inserted into an insertion area, the nozzle may penetrate the insertion area while pushing the insertion area through a slit. When the nozzle is extracted, a shape of the insertion area may be restored. When an injection of the thermal interface material through the nozzle is completed, the nozzle may be extracted, and the insertion area may be restored to a state in which external force is not applied, in order to cover a through hole. A sealing member may reduce flowing back of the injected thermal interface material through the through hole.

For example, the at least one opening part 323, 254a, and 254b may include a second through hole 254 formed on the printed circuit board 250, and passing through the first surface 251 and the second surface 252. The second through hole 254 may face the first shield can 320, and may be spaced apart from the first through hole 253. According to an example of the disclosure, since air in an internal space of a shield can flows to an external space of the shield can through a second through hole, ventilation may be performed smoothly. After a mounting process is completed, a temperature inside the shield can may be lowered by the ventilation through the second through hole.

For example, the electronic device 101 may further include a second electronic component 360 disposed on the second surface 252. The electronic device 101 may further include a second shield can 350 disposed on the second surface 252, facing at least partially the first shield can 320, and covering the second electronic component 360. The electronic device 101 may further include another thermal interface material 370 located on the second electronic component 360. According to an example of the disclosure, electronic components may be disposed on both surfaces of a printed circuit board. The first shield can and the second shield can may partially face each other.

For example, the second shield can 350 may include a third opening 351 aligned with the second electronic component 360. According to an example of the disclosure, the thermal interface material may be applied on the second electronic component through the third opening.

For example, the first through hole 253 may face the first shield can 320 and may be spaced apart from the second shield can 350. According to an example of the disclosure, the second shield can may be spaced apart from the first through hole. A nozzle for injecting a thermal interface material may be inserted into the second surface. Since the first through hole is spaced apart from the second shield can, even when a process for flipping a printed circuit board is not exist, the thermal interface material may be injected into the first shield can, and may be applied on the second electronic component.

For example, the at least one opening part 323, 254a, and 254b may include a second through hole 254 formed on the printed circuit board 250, passing through the first surface 251 and the second surface 252, and spaced apart from the first through hole 253. The second through hole 254 may include a third through hole 254a facing the first shield can 320 and the second shield can 350. The second through hole 254 may a fourth through hole 254b facing the first shield can 320 and spaced apart from the second shield can 350. According to an example of the disclosure, the thermal interface material may be transferred from an internal space of a first shield can to an internal space of a second shield can. Since the third through hole faces another shield can, the thermal interface material may entirely fill the internal space of the first shield can and then flow to the internal space of the second shield can through the third through hole. According to an example, since the thermal interface material may be injected into the internal space of the first shield can and the internal space of the second shield can in a single process, the process may be simplified.

For example, a diameter of the third through hole 254a may be larger than a diameter of the fourth through hole 254b. According to an example of the disclosure, the third through hole may have a diameter capable of passing the thermal interface material. When the diameter of the third through hole is too small, the thermal interface material may not pass through the third through hole or high pressure may be required. As the third through hole has a relatively large diameter, the thermal interface material may be transferred from the internal space of the first shield can to the internal space of the second shield can.

For example, the thermal interface material 330 may occupy an internal space of the first shield can 320 and at least partially occupy an internal space of the second shield can 350. According to an example of the disclosure, since the thermal interface material may be transferred to the second shield can internal space, the second shield can internal space may be at least partially filled with the thermal interface material. The thermal interface material may be difficult to be applied to a second electronic component not aligned with an opening. The second electronic component not aligned with the opening may be in contact with the thermal interface material introduced through another through hole. According to an example, heat emitted from the second electronic component may be diffused through the thermal interface material.

For example, the second shield can 350 may include a third opening 352 facing the first through hole 253. According to an example of the disclosure, a nozzle may be inserted through a third opening. Since the thermal interface material does not need to pass through a narrow passage, even when an emission pressure of the nozzle is relatively low, the thermal interface material may be filled. According to an example, since a passage for a thermal interface material is not required, a design of a printed circuit board is simplified, and various electronic components may be connected to the printed circuit board. Since it is not necessary to flip the printed circuit board for injection of the thermal interface material, an additional process may not be required. According to an example, through a simple structure change of the second shield can including the third opening, the thermal interface material may be provided in both the internal space of the first shield can and the internal space of the second shield can.

For example, the thermal interface material 330 may be injected into the space S1 between the first surface 251 and the first shield can 320, through the first through hole 253, in a direction from the second surface 252 to the first surface 251.

An electronic device 101 is provided. The electronic device 101 may include a printed circuit board 250 including a first surface 251, a second surface 252 opposite to the first surface 251, and a first through hole 253 passing through the first surface 251 and the second surface 252. The electronic device 101 may include a first electronic component 310 disposed on the first surface 251. The electronic device 101 may include a second electronic component 360 disposed on the second surface 252. The electronic device 101 may include a first shield can 320 disposed on a partial area of the first surface 251 including the first through hole 253, and covering the first electronic component 310. The electronic device 101 may include a second shield can 350 disposed on the second surface 252, facing at least partially the first shield can 320, spaced apart from the first through hole 253, and covering the second electronic component 360. The electronic device 101 may include a thermal interface material 330 injected through the first through hole 253, and included in a space S1 between the first surface 251 and the first shield can 320. The thermal interface material 330 may occupy a space between a first part 321 of the first shield can 320 parallel to the first surface 251 and the first electronic component 310, and at least partially contact with the first electronic component 310.

For example, the electronic device 101 may further include a sealing member 340 disposed on the second surface 252 and covering the first through hole 253. The sealing member 340 may include an insertion area 341 allowing insertion of a nozzle 400 in a direction from the second surface 252 to the first surface 251.

For example, the printed circuit board 250 may include a second through hole 254 passing through the first surface 251 and the second surface 252 and spaced apart from the first through hole 253.

For example, the second through hole 254 may include a third through hole 254a facing the first shield can 320 and the second shield can 350. The second through hole 254 may include a fourth through hole 254b facing the first shield can 320 and spaced apart from the second shield can 350.

For example, a diameter of the third through hole 254a may be larger than a diameter of the fourth through hole 254b.

According to an example, an electronic device may include a printed circuit board, a first shield can, a second shield can, and a thermal interface material. For example, the printed circuit board may include a first surface and a second surface opposite to the first surface. The printed circuit board may include a through hole passing through the first surface and the second surface. The first shield can may be disposed on the first surface. The first shield can may cover a partial area of the first surface including the through hole. The first shield can may cover a first electronic component disposed on the first surface. The second shield can may be disposed on the second surface. The second shield can may cover a second electronic component disposed on the second surface. The thermal interface material (e.g., the thermal interface material 330 of FIG. 4B and the thermal interface material 370 of FIG. 10C) may be located on a space between the first surface and the first shield can and the second electronic component. The second shield can may include at least one opening (e.g., the third opening 351 and the third opening 352 of FIG. 15) formed in a part of the second shield can parallel to the second surface. The thermal interface material (e.g., the thermal interface material 330 of FIG. 4B) injected into the space between the first surface and the first shield can may be injected in a direction from the second surface toward the first surface, through the through hole. The thermal interface material (e.g., the thermal interface material 370 of FIG. 10C) injected into the second electronic component may be injected through the at least one opening.

According to an example, a posture of the printed circuit board may be maintained while the thermal interface material is injected to a space between the first surface and the first shield can and the second electronic component. For example, since it is not necessary to flip the printed circuit board for injection of the thermal interface material, an additional process may not be required.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a printed circuit board including a first surface, a second surface opposite to the first surface, and a first through hole passing through the first surface and the second surface;
a first electronic component disposed on the first surface;
a first shield can disposed on a partial area of the first surface including the first through hole, and covering the first electronic component; and
a thermal interface material injected through the first through hole, and included in a space (S1) between the first surface and the first shield can,
wherein the first shield can includes:
a first part substantially parallel to the first surface, and
a second part extending from a periphery of the first part to the first surface and coupled to the first surface,
wherein the thermal interface material at least partially occupies a space between the first part and a surface of the first electronic component facing the first part, and is at least partially in contact with the first electronic component, and
wherein the space between the first surface and the first shield can is connected to an external space of the first shield can through at least one opening part formed in at least one of the first shield can or the printed circuit board.

2. The electronic device of claim 1,
wherein the at least one opening part includes a first opening formed on the second part of the first shield can and including a periphery of the first shield can that contacts with the first surface, and
wherein a height of the first opening is lower than a height of the second part.

3. The electronic device of claim 1, wherein the first shield can includes at least one first protrusion, the at least one first protrusion extending from position adjacent to a partial area of the first part facing the first through hole in a longitudinal direction of the first shield can.

4. The electronic device of claim 1,
wherein the first shield can includes a second protrusion extending from a partial area of the first part facing the first through hole toward the first surface, and
wherein the second protrusion is stepped.

5. The electronic device of claim 1, wherein a height from the partial area of the first part facing the first through hole to the first surface is lower than a height from another area of the first part spaced from the partial area to the first surface.

6. The electronic device of claim 1, further comprising:
a sealing member disposed on the second surface and covering the first through hole,
wherein the sealing member includes an insertion area allowing insertion of a nozzle for injecting the thermal interface material.

7. The electronic device of claim 1,
wherein the at least one opening part includes a second through hole formed on the printed circuit board, and passing through the first surface and the second surface, and
wherein the second through hole faces the first shield can, and is spaced apart from the first through hole.

8. The electronic device of claim 1, further comprising:
a second electronic component disposed on the second surface;
a second shield can disposed on the second surface, facing at least partially the first shield can, and covering the second electronic component; and
another thermal interface material located on the second electronic component.

9. The electronic device of claim 8, wherein the second shield can includes a third opening aligned with the second electronic component.

10. The electronic device of claim 8, wherein the first through hole faces the first shield can and is spaced apart from the second shield can.

11. The electronic device of claim 8,
wherein the at least one opening part includes a second through hole formed on the printed circuit board, passing through the first surface and the second surface, and spaced apart from the first through hole, and
wherein the second through hole includes:
a third through hole facing the first shield can and the second shield can, and
a fourth through hole facing the first shield can and spaced apart from the second shield can.

12. The electronic device of claim 11, wherein a diameter of the third through hole is larger than a diameter of the fourth through hole.

13. The electronic device of claim 8, wherein the thermal interface material occupies an internal space of the first shield can and at least partially occupies an internal space of the second shield can.

14. The electronic device of claim 8, wherein the second shield can includes a third opening facing the first through hole.

15. The electronic device of claim 1, wherein the thermal interface material is injected into the space between the first surface and the first shield can, through the first through hole, in a direction from the second surface to the first surface.

16. An electronic device comprising:
a printed circuit board including a first surface, a second surface opposite to the first surface, and a first through hole passing through the first surface and the second surface;
a first electronic component disposed on the first surface;
a second electronic component disposed on the second surface;
a first shield can disposed on a partial area of the first surface including the first through hole, and covering the first electronic component;
a second shield can disposed on the second surface, facing at least partially the first shield can spaced apart from the first through hole, and covering the second electronic component; and
a thermal interface material injected through the first through hole, and included in a space between the first surface and the first shield can, wherein the thermal interface material occupies a space between a first part of the first shield can parallel to the first surface and the first electronic component, and wherein at least partially contacts with the first electronic component.

17. The electronic device of claim 16, further comprising:

a sealing member disposed on the second surface and covering the first through hole, wherein the sealing member includes an insertion area allowing insertion of a nozzle in a direction from the second surface to the first surface.

18. The electronic device of claim 16, wherein the printed circuit board includes a second through hole passing through the first surface and the second surface and spaced apart from the first through hole.

19. The electronic device of claim 18, wherein the second through hole includes:

a third through hole facing the first shield can and the second shield can; and a fourth through hole facing the first shield can and spaced apart from the second shield can.

20. The electronic device of claim 19, wherein a diameter of the third through hole is larger than a diameter of the fourth through hole.

\* \* \* \* \*